(12) United States Patent
Seabaugh et al.

(10) Patent No.: US 8,796,733 B2
(45) Date of Patent: Aug. 5, 2014

(54) LOW VOLTAGE TUNNEL FIELD-EFFECT TRANSISTOR (TFET) AND METHOD OF MAKING SAME

(75) Inventors: Alan C. Seabaugh, South Bend, IN (US); Patrick Fay, Granger, IN (US); Huili (Grace) Xing, South Bend, IN (US); Guangle Zhou, South Bend, IN (US); Yeqing Lu, Notre Dame, IN (US); Mark A. Wistey, South Bend, IN (US); Siyuranga Koswatta, Yorktown Heights, NY (US)

(73) Assignees: University of Notre Dame du Lac, Notre Dame, IN (US); International Business Machines Corporation, Armonk, NY (US)

( * ) Notice: Subject to any disclaimer, the term of this patent is extended or adjusted under 35 U.S.C. 154(b) by 80 days.

(21) Appl. No.: 13/206,187

(22) Filed: Aug. 9, 2011

(65) Prior Publication Data

US 2012/0032227 A1    Feb. 9, 2012

Related U.S. Application Data

(60) Provisional application No. 61/401,228, filed on Aug. 9, 2010.

(51) Int. Cl.
*H01L 29/66* (2006.01)
(52) U.S. Cl.
USPC .......................................................... 257/183
(58) Field of Classification Search
USPC ........................................ 257/17, 25, 183.01
See application file for complete search history.

(56) References Cited

U.S. PATENT DOCUMENTS 8,309,989 B2    11/2012 Luisier et al.

OTHER PUBLICATIONS

Hu et al., "Green Transistor—A VDD Scaling Path for Future Low Power ICs", Symposium on VLSI Technology, Systems and Applications (2008 VLSI-TSA), pp. 14-15, Apr. 2008.*
Agarwal et al., "Leakage-reduction design concepts for low-power vertical tunneling field-effect transistors," IEEE Electron Device Lett., vol. 31, No. 6, pp. 621-623, Jun. 2010.*
Samarth Agarwal, Ph.D. defense, Purdue University, Jul. 2010.*

* cited by examiner

*Primary Examiner* — Thomas L Dickey
(74) *Attorney, Agent, or Firm* — Greenberg Traurig, LLP

(57) ABSTRACT

A low voltage tunnel field effect transistor includes a p-n tunnel junction, a gate-dielectric, a gate, a source-contact, and a drain-contact. The p-n tunnel junction includes a depletion region interfacing together a source-layer and a drain-layer. The depletion region includes a source-tunneling-region of the source-layer and a drain-tunneling-region of the drain-layer. When no external electric field is imposed, the depletion region of the p-n tunnel junction has an internal electric field that substantially points towards the source-tunneling-region and the drain-tunneling-region. The gate-dielectric is interfaced directly onto the drain-tunneling-region such that the drain-tunneling-region is between the source-tunneling-region and the gate-dielectric. The gate is interfaced onto the gate-dielectric such that the gate is configured to impose an external electric field which is oriented substantially in parallel to the internal electric field of the depletion region.

16 Claims, 26 Drawing Sheets

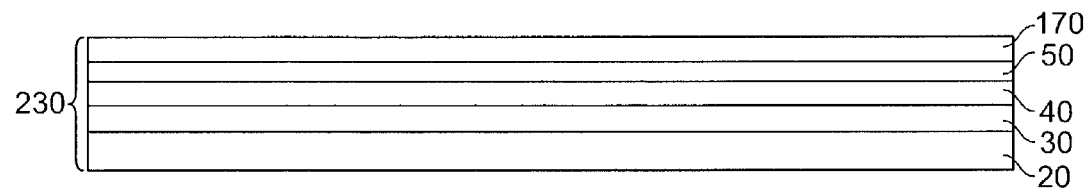
Cross Sectional Side View
FIG. 4A'
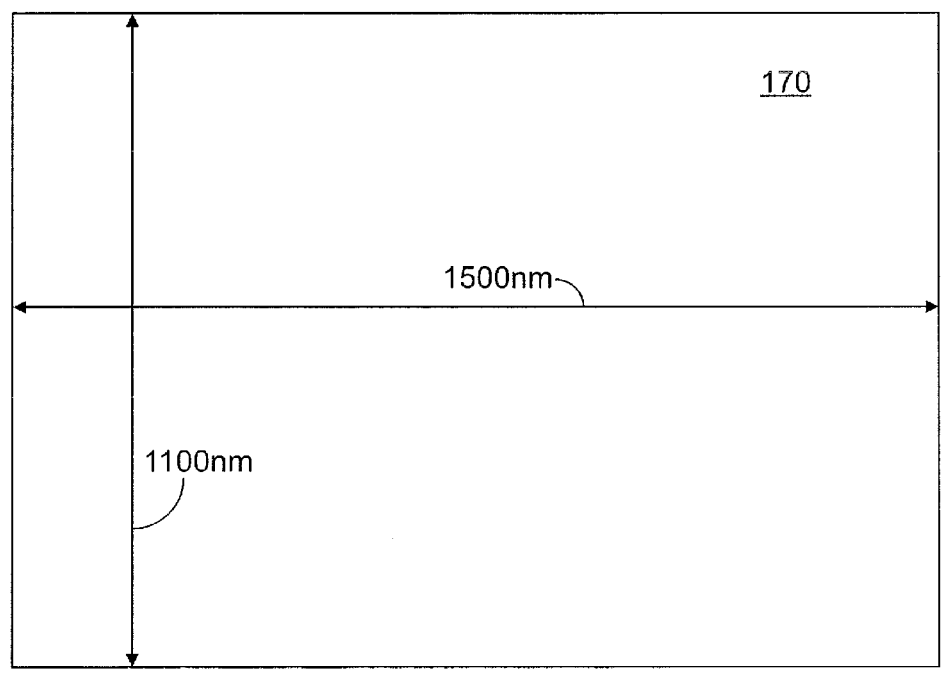
Top View
FIG. 4A"

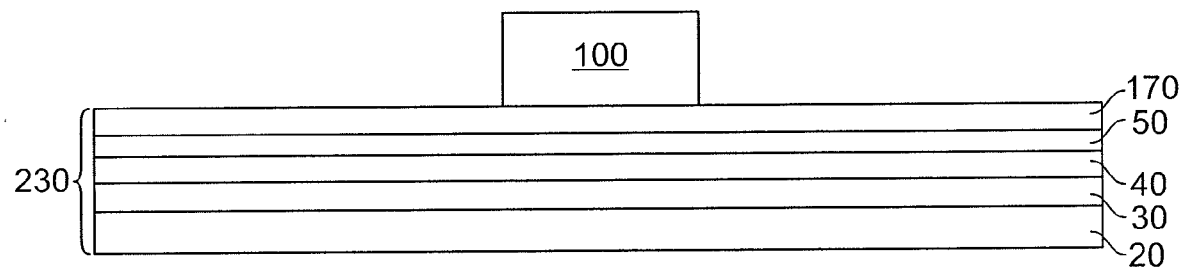
Cross Sectional Side View
FIG. 4B'
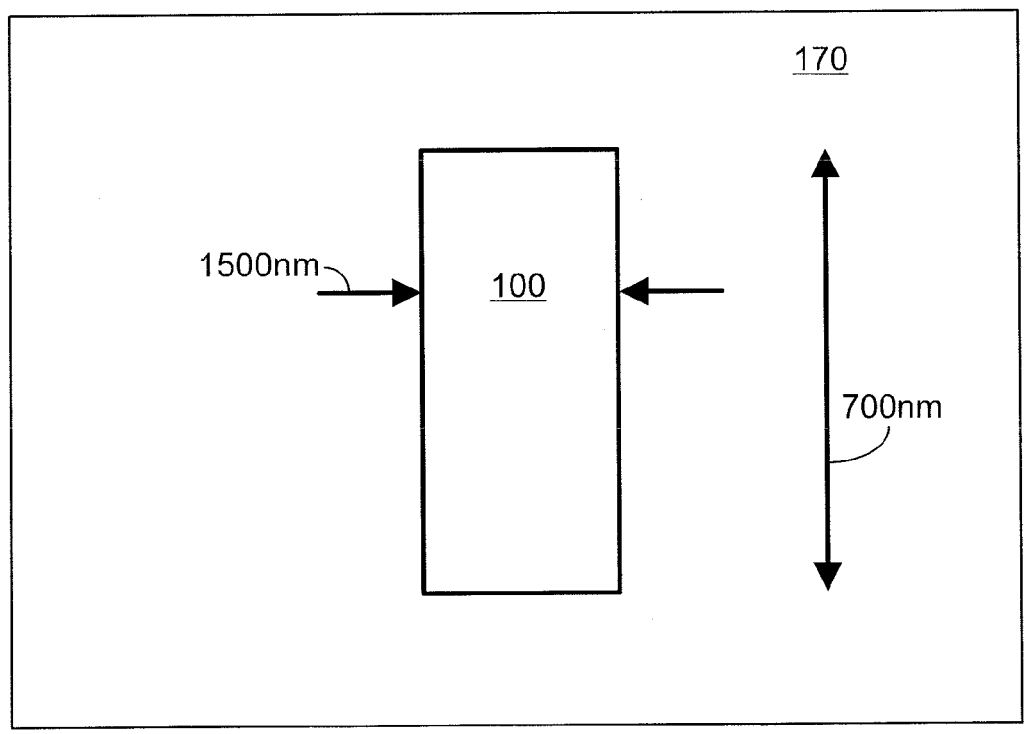
Top View
FIG. 4B"

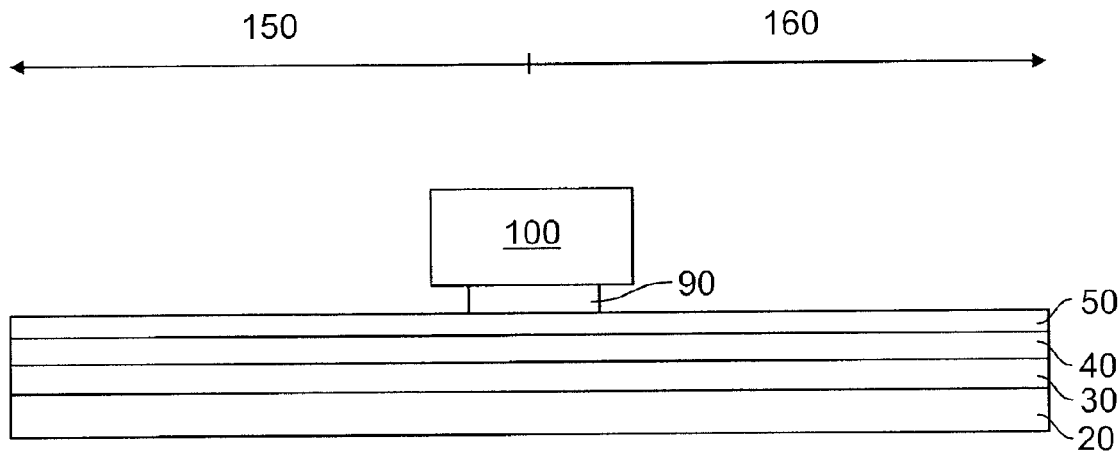
Cross Sectional Side View
FIG. 4C'
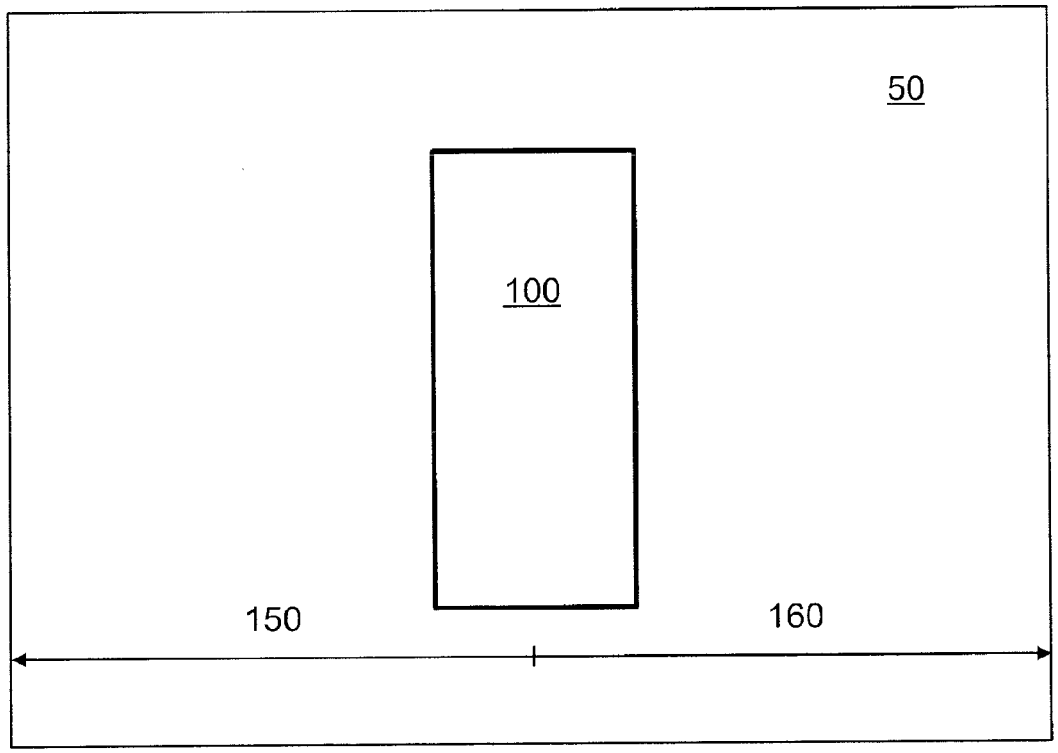
Top View
FIG. 4C"

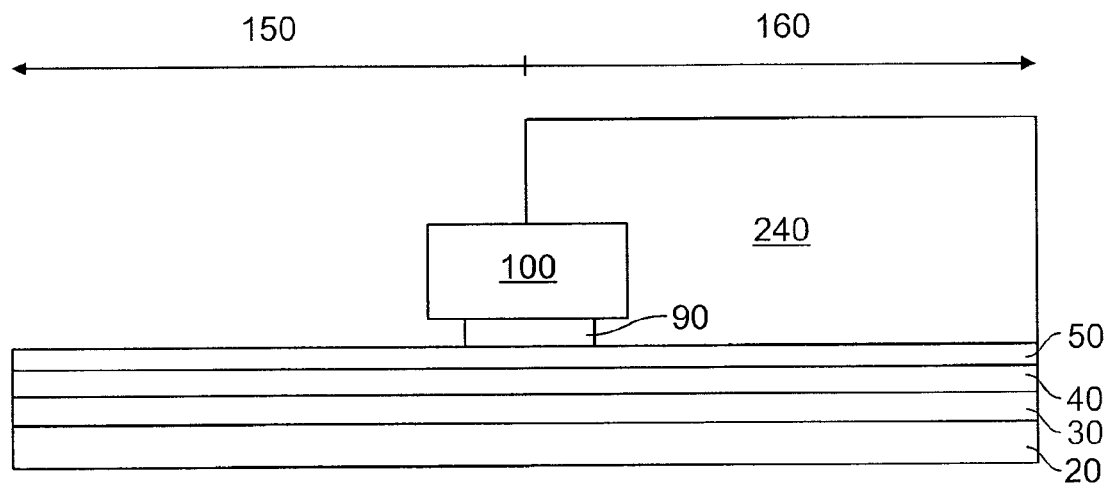
Cross Sectional Side View
FIG. 4D'
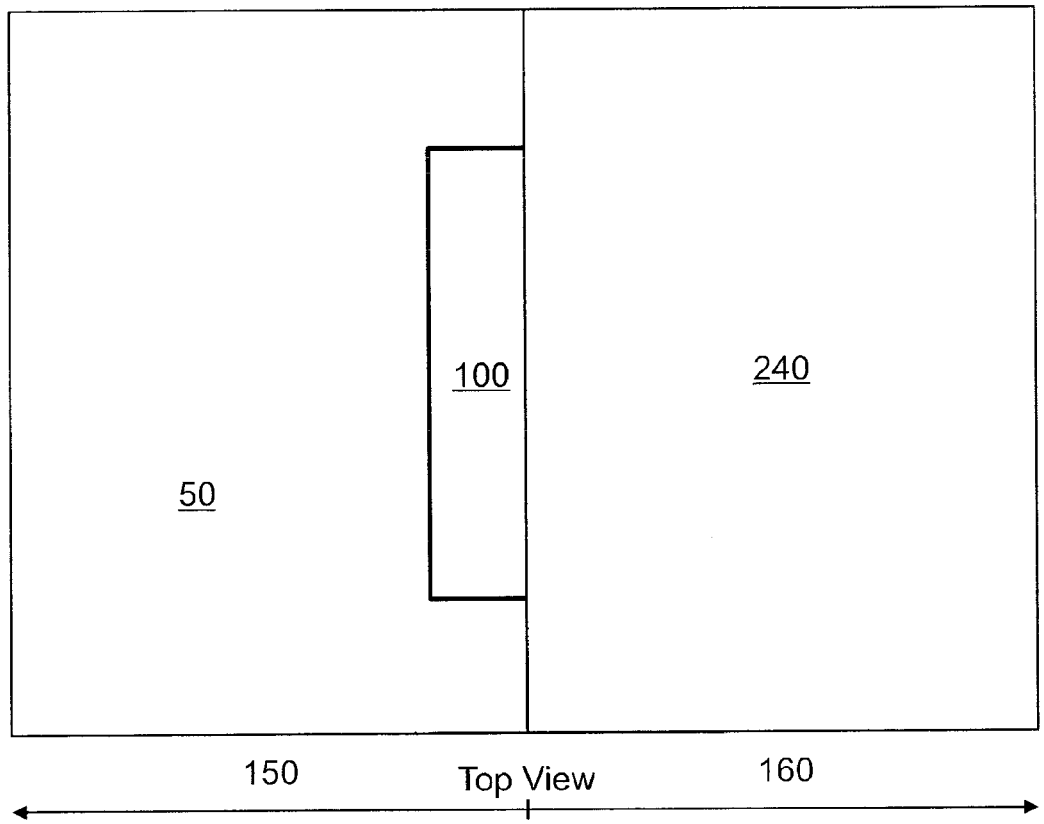
Top View
FIG. 4D"

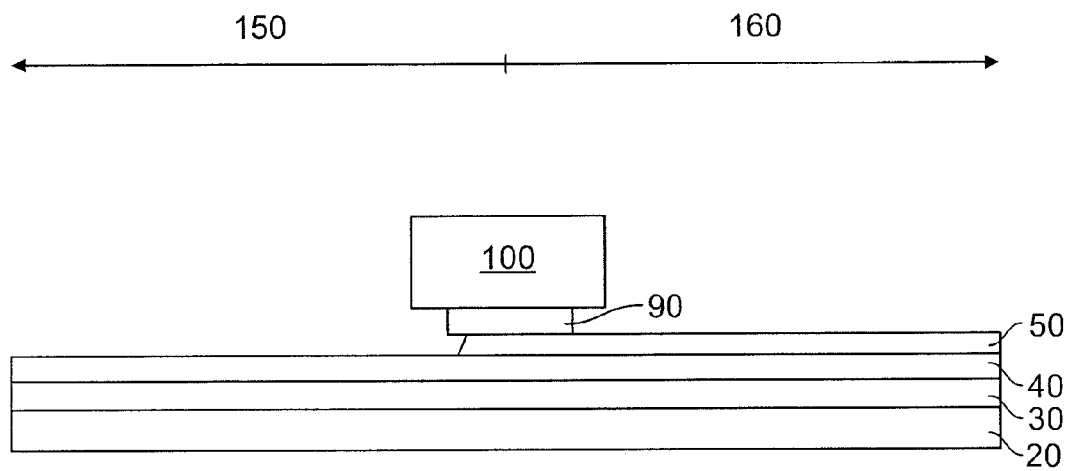
Cross Sectional Side View
FIG. 4E'
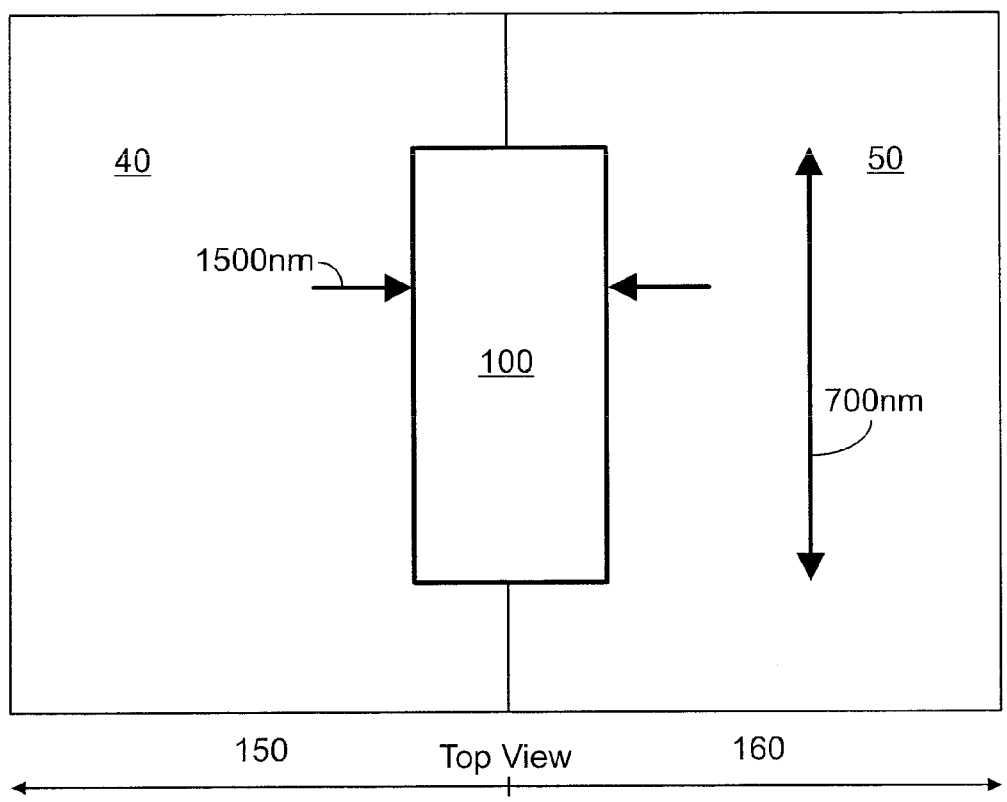
Top View
FIG. 4E"

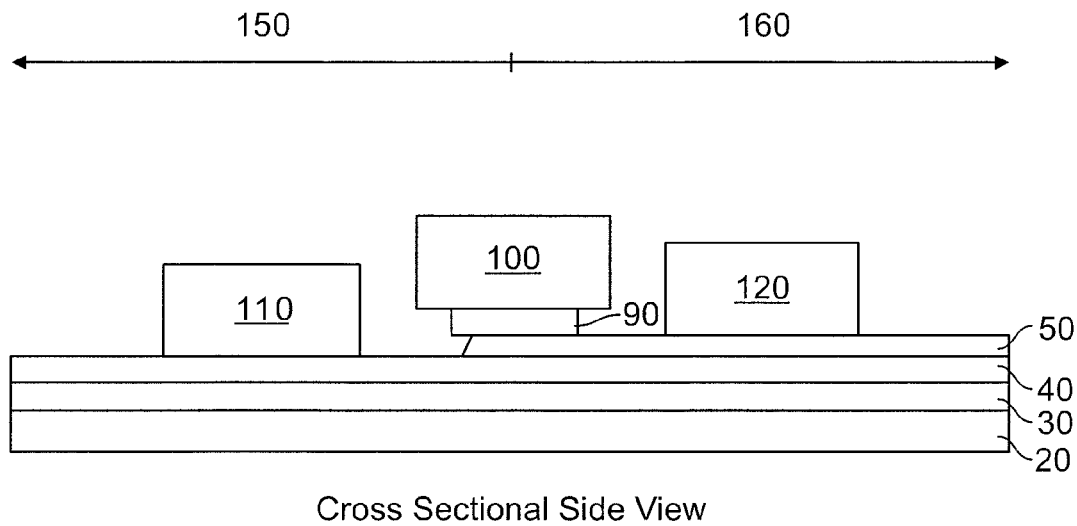
Cross Sectional Side View
FIG. 4F'
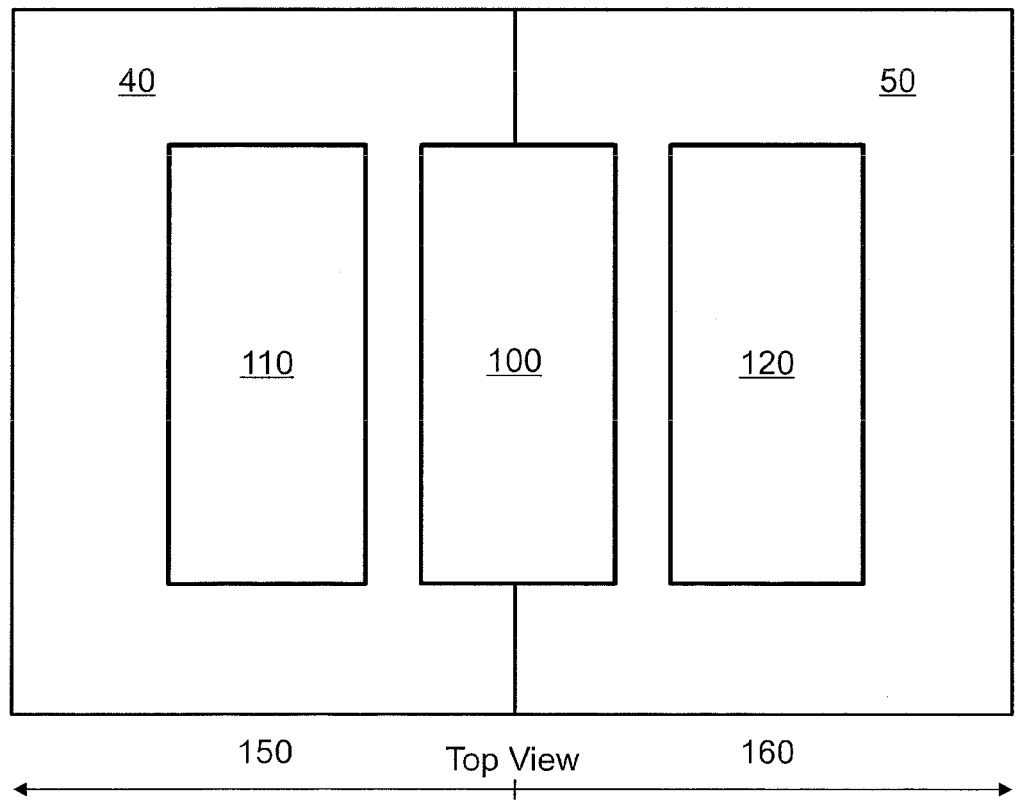
Top View
FIG. 4F"

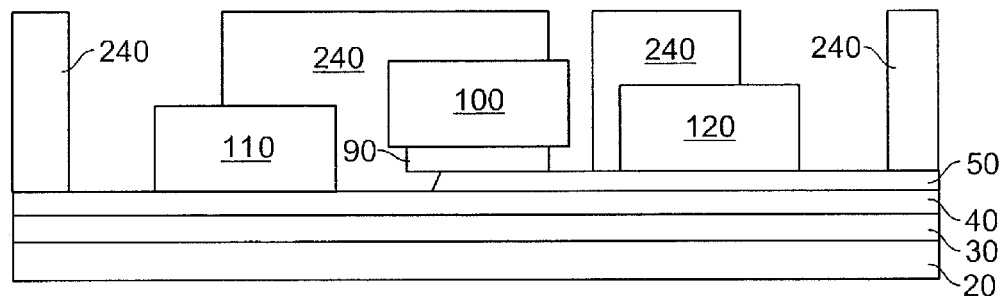
Cross Sectional Side View
FIG. 4G'
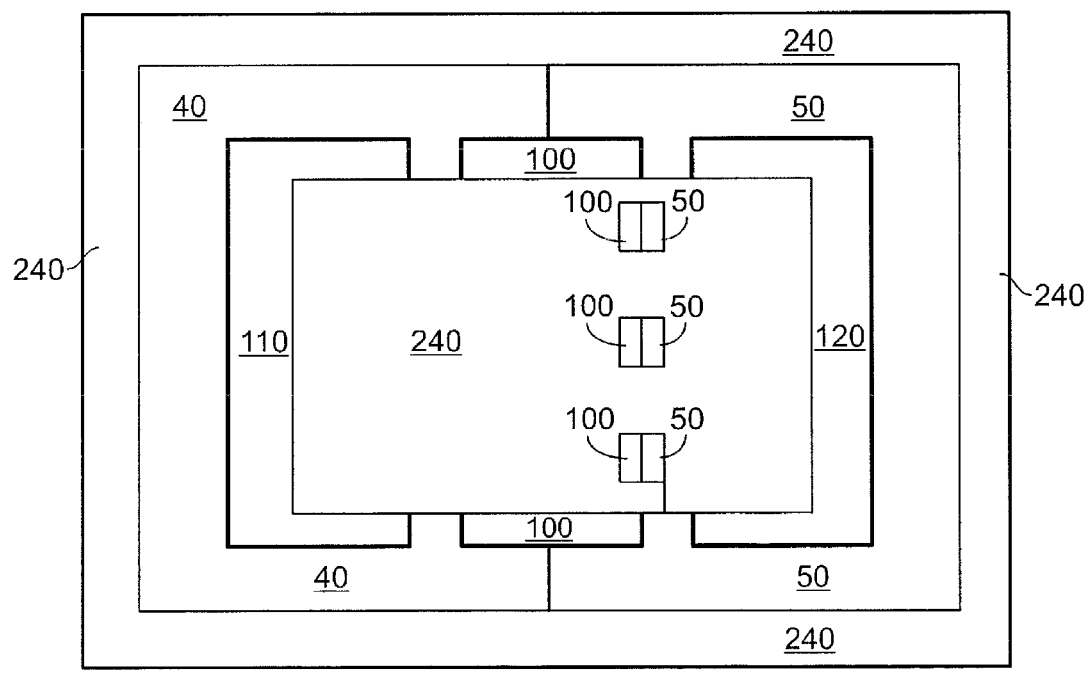
Top View
FIG. 4G"

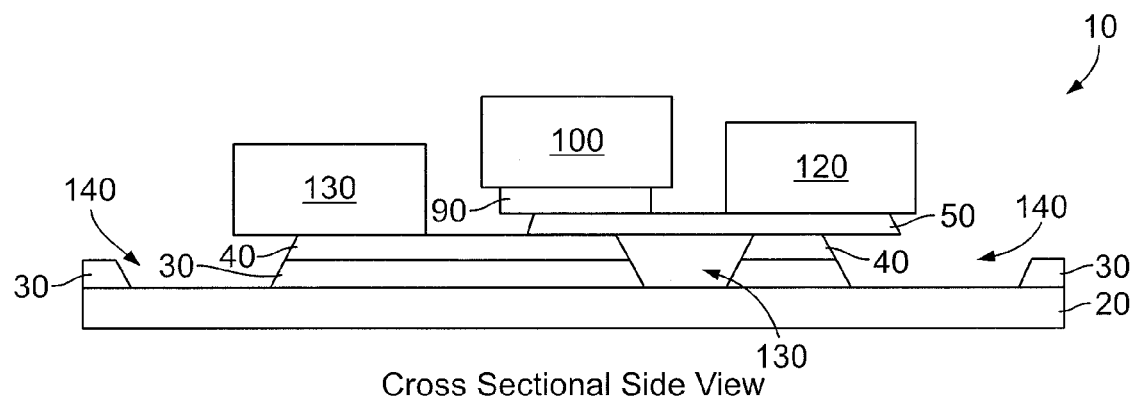
Cross Sectional Side View
FIG. 4H'
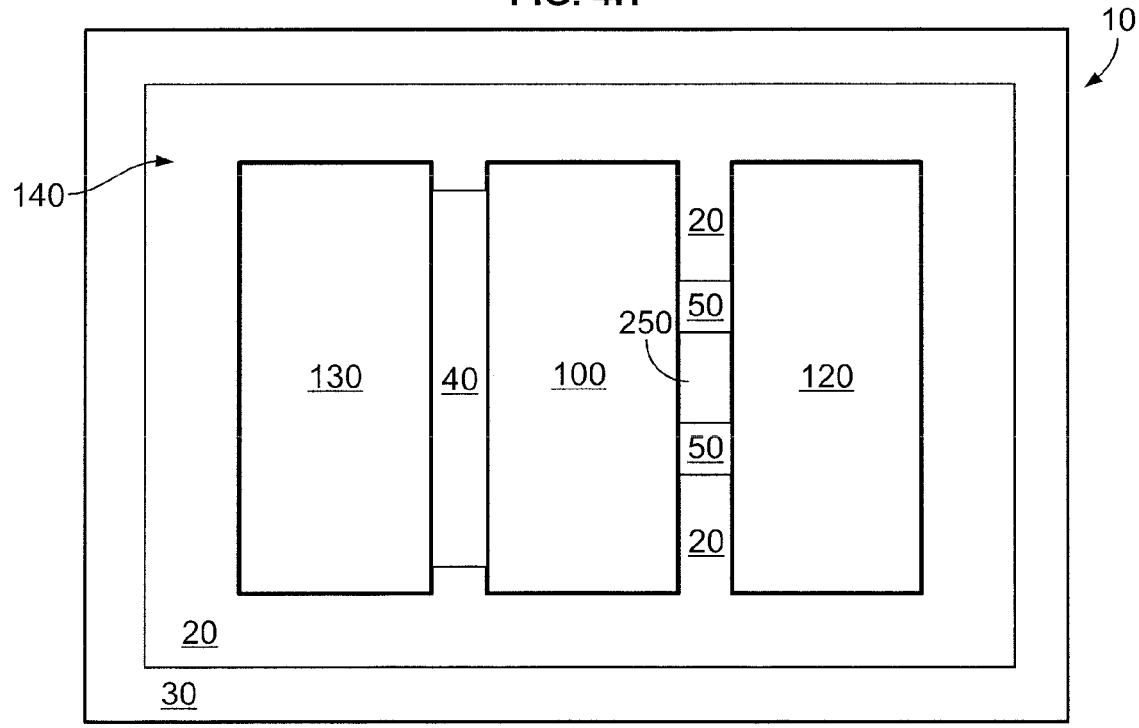
Top View
FIG. 4H"

| Layer description | | |
|---|---|---|
| nm | material | /cm3 |
| 30 | n InAs | 1.E17 |
| 20 | p+Al0.45Ga0.55Sb | 4.E18 |
| 10 | p+Al0.30Ga0.70Sb | 4.E18 |
| 10 | p+Al0.15Ga0.85Sb | 4.E18 |
| 30 | p+GaSb | 5.E18 |
FIG. 6A
- wet etch GaSb cap, ALD Al2O3
- pattern/lift-off gate
- pattern/etch Al2O3 from source
- selectively etch InAs from source
- pattern/lift-off source/drain
- pattern airbridges
- moat etch under airbridge
FIG. 6B
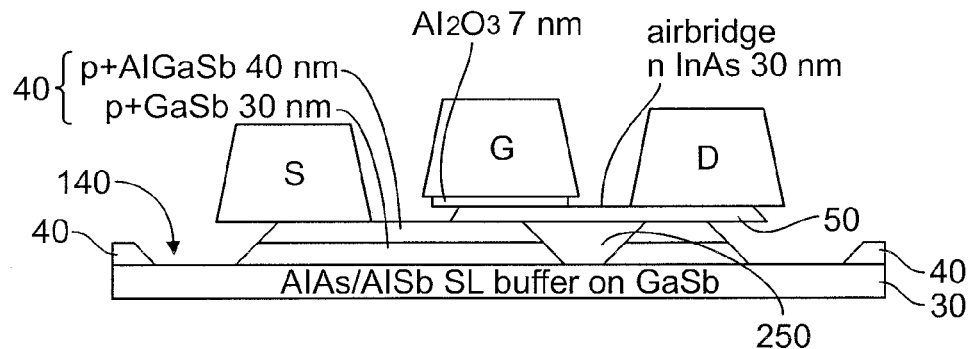
FIG. 6C
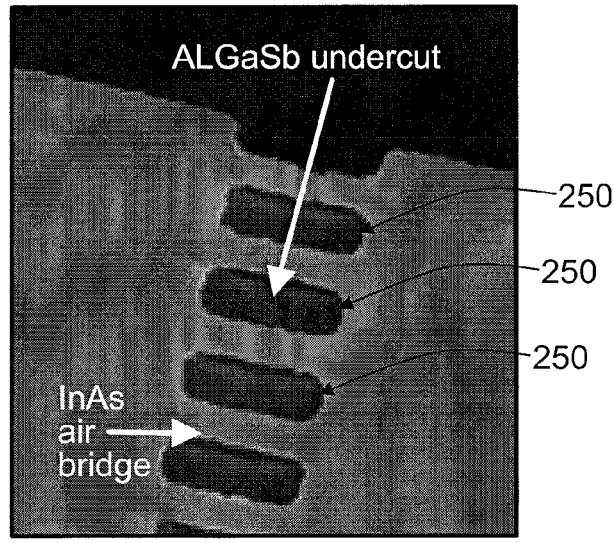
FIG. 8

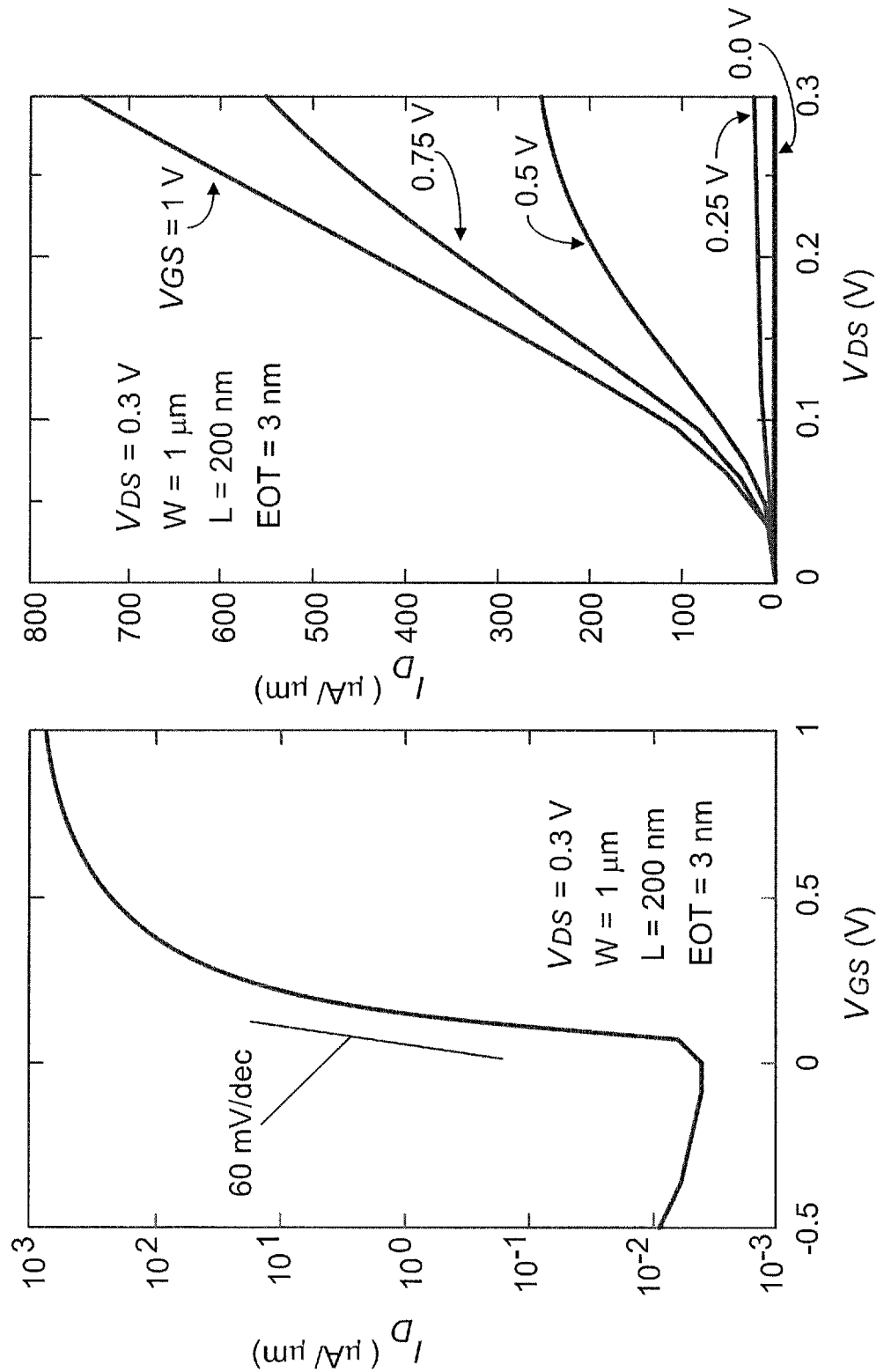

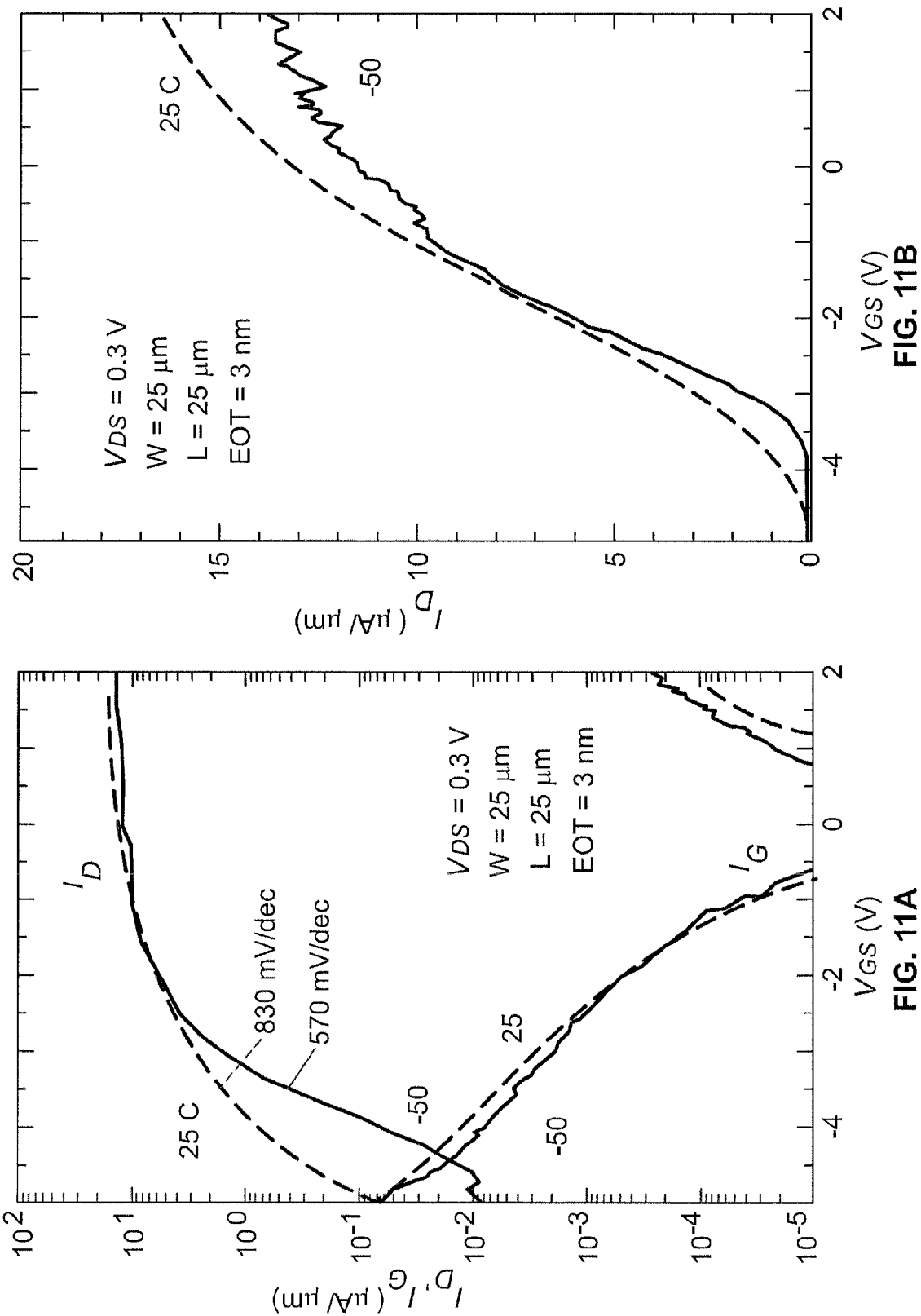

LOW VOLTAGE TUNNEL FIELD-EFFECT TRANSISTOR (TFET) AND METHOD OF MAKING SAME

GOVERNMENTAL FUNDING

This invention was made with government support under NIST award number 70NANB7H6168 awarded by NIST. The government has certain rights in the invention.

CROSS REFERENCE TO RELATED APPLICATION

This application is a non-provisional application claiming priority from U.S. Provisional Application Ser. No. 61/401,228, filed Aug. 9, 2010, entitled "METHOD FOR FABRICATION OF LOW SUBTRESHOLD SWING VERTICAL TUNNEL FIELD EFFECT TRANSISTORS" and incorporated herein by reference in its entirety.

FIELD OF THE DISCLOSURE

The present disclosure generally relates to low voltage switching devices and more particularly to low voltage tunnel field effect transistor devices and methods of making same.

BACKGROUND

As the end of miniaturization appears to approach for complementary metal-oxide-semiconductor (CMOS) technology, the search for devices to extend computer performance is on. This new technology should be energy efficient, dense, and enable more device function per unit space and time. There have been device proposals, often involving new state variables and communication frameworks.

Tunnel field-effect transistors (TFET) are under intense investigation for low-power applications because of their potential for exhibiting extremely low subthreshold swing (SS) and low off-state leakage. TFET devices are aimed at using supply voltages of less than 0.5 V, enabled by a lower subthreshold swing and do not have the delays associated with positive feedback that are intrinsic to impact ionization, ferroelectricity, and mechanical mechanisms. Further, III-V semiconductors with small effective mass and near broken band alignment are considered to be ideal for TFETs in that they promise high on-current and $I_{ON}/I_{OFF}$ ratios. Accordingly, TFETs compete directly with the MOS field-effect transistor (FET) in power, area, and speed, in a commercial temperature range 0° C.-75° C., and in a von Neumann architecture.

TFETs are understood herein to be those types of semiconductor devices that have their source-drain current controlled by an external electric field imposed by a gate. The TFET source-drain current is believed to be brought about by band-to-band tunneling of electrons between adjacent source and drain semiconductors.

FIG. 1 depicts a known TFET 10 that comprises an intrinsic-layer 350 interfacing together a p-doped source-layer 40 and an n-doped drain-layer 50. By aligning the source-layer 40, the intrinsic-layer 350 and the drain-layer 50 along a commonly shared line, i.e., a major axis, the TFET 10 is configured as what is known as a pin TFET 10. The pin TFET 10 also comprises a gate-dielectric 90 and a gate 100 in which the gate-dielectric 90 interfaces together the gate 100 and the source-layer 40. In the pin-TFET configuration, the gate 100 and gate-dielectric 90 are positioned off of the major axis of the TFET by being perpendicular to the commonly shared line defined by the source-layer 40, the intrinsic-layer 350 and the drain-layer 50. As a result of being off-axis the gate 100 imposes an external electric field 310 perpendicular to the internal electric field 300 of the depletion region 320. Also shown is the source-contact 110 and the drain-contact 120 of the TFET 10.

BRIEF DESCRIPTION OF THE DRAWINGS

The disclosure will be better understood and aspects other than those set forth above will become apparent when consideration is given to the following detailed description thereof. Such description makes reference to the annexed drawings wherein:

FIGS. 4A', 4A", 4B', 4B", 4C', 4C", 4D', 4D", 4E', 4E", 4F', 4F", 4G', 4G", 4H', and 4H" depict cross sectional side views with corresponding top views of some of the example steps in fabricating an example TFET of the present application are depicted;

FIGS. 6a-c depict (a) a layer description, (b) a process steps, and (c) a stylized cross sectional view of an example of a TFET of the present application;

FIG. 8 is a scanning electron micrograph of InAs airbridges;

FIGS. 10a-b depict simulation results of an example TFET device (a) common source $I_D$-$V_{GS}$ and (b) family $I_D$-$V_{GS}$;

FIGS. 11a-b are measured (a) log ID-$V_{GS}$ (b) linear $I_D$-$V_{GS}$ curve results of the TFET of the present application;

The same reference numerals refer to the same parts throughout the various figures.

DETAILED DESCRIPTION

The present disclosure will now be described more fully with reference to the accompanying drawings, in which examples of the disclosure are shown. The disclosure may be, however, embodied in many different forms and should not be construed as being limited to these variations as set forth herein; rather, these examples are provided so that this disclosure will be thorough and complete, and will fully convey the concept of the disclosure to those of ordinary skill in the art.

The drawings are not necessarily to scale and in some instances proportions may have been exaggerated in order to more clearly depict certain features of the disclosure. Further, it should be understood that, although various steps of various the disclosed methods may be shown and described as being in a sequence or temporal order, the steps of any such method are not necessarily limited to being carried out in any particular sequence or order, absent an indication otherwise. That is, the method steps are to be considered to be capable of being carried out in any sequential combination or permutation order while still falling within the scope of the present disclosure.

Figure 1:
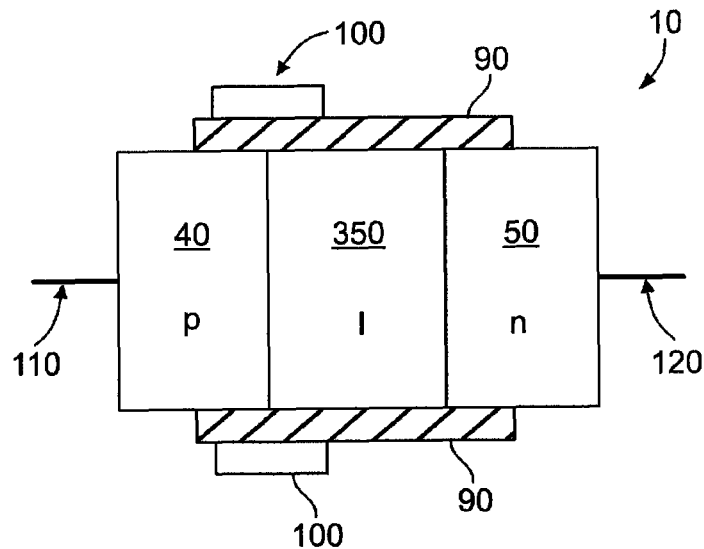
FIG. 1 depicts a known TFET configured as a pin-TFET.
Figure 2:
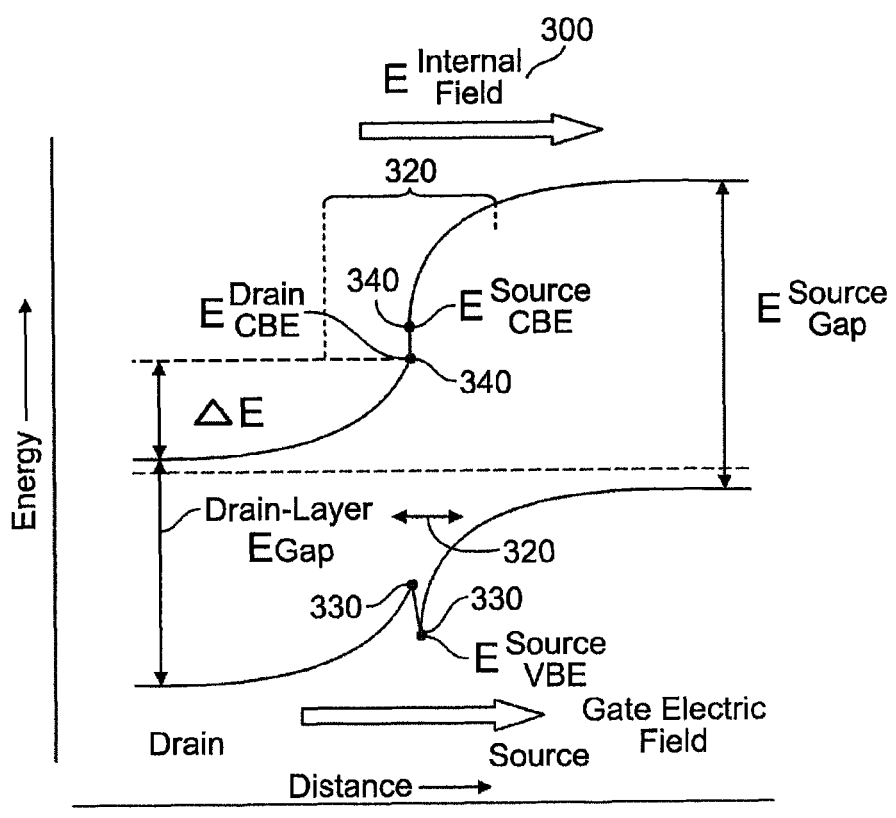
FIG. 2 depicts a stylized energetic and distance profile of an example TFET of the present application.

FIG. 2 depicts a stylized energetic and distance profile at an interface between a source-layer 40 and a drain-layer 50 composed of two different types of semiconductors that have different bandgaps. In this example, the source-layer energy bandgap, $E_{gap}^{Source}$, is greater than the drain-layer energy bandgap, $E_{gap}^{Drain}$. When no external electric field 310 is imposed, an internal electric field (4E) can develop within a depletion region 320. If the source-layer 40 and the drain-layer 50 are composed of different types of semiconductors, the valence band edges 330 of the source-layer 40 and conduction band edges 340 of the drain-layer 50 do not necessarily match up. However, when no external electric field 310 is imposed across this juncture, the Fermi level ($E_F$) across the source-layer 40 and drain-layer 50 is thought to be uniform and result in creating an internal electric field 300.

Figure 3A:
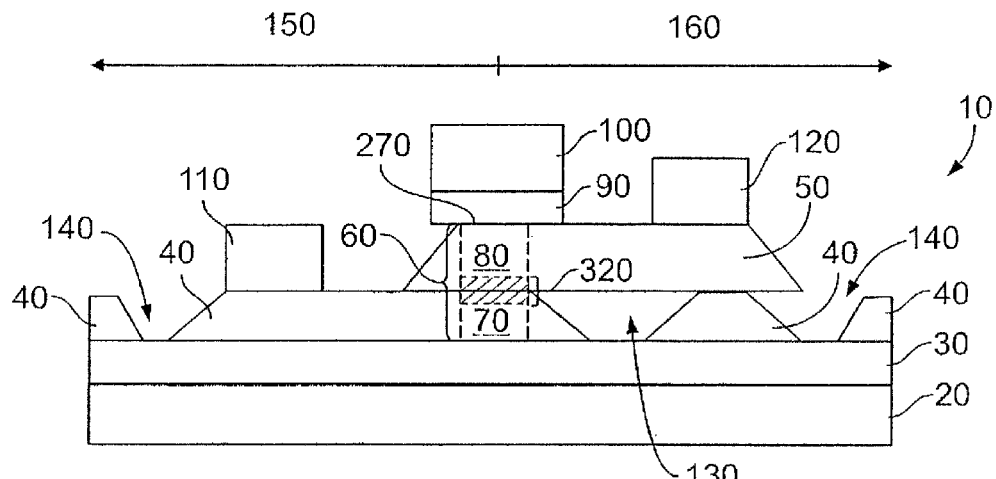
FIGS. 3a-b depict stylized cross section side view of example TFETs of the present application.
Figure 3B:
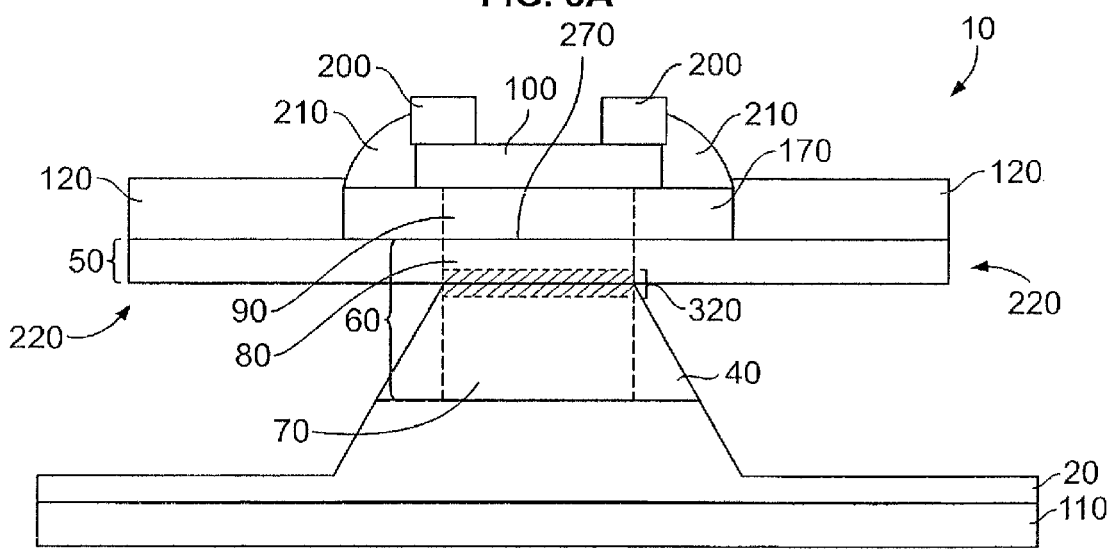

Referring now to FIGS. 3a-b, 4H', 4H", 5G-I, 6C, 9A-B and 15A-B, device examples of the tunnel field-effect transistor (TFET 10) of the present application comprise a p-n tunnel junction 60, a gate-dielectric 90, a gate 100, a source-contact 110, and a drain-contact 120. The p-n tunnel junction 60 comprises a source-layer 40, a drain-layer 50, and a depletion region 320. The source-layer 40 of the p-n tunnel junction 60 includes a source-tunneling-region 70. The drain-layer 50 of the p-n tunnel junction 60 includes a drain-tunneling-region 80. The depletion region 320 of the p-n tunnel junction 60 is that interface between the source-tunneling-region 70 and drain-tunneling-region 80. The depletion region 320 of the p-n tunnel junction 60 exhibits an internal electric field 300 that substantially points towards the source-tunneling-region 70 and drain-tunneling-region 80 when no external electric field 310 is imposed. The gate-dielectric 90 is interfaced onto the drain-tunneling-region 80 such that the drain-tunneling-region 80 is immediately between the source-tunneling-region 70 and the gate-dielectric 90. The gate 100 is interfaced onto the gate-dielectric 90 such that the gate 100 is configured to impose an external electric field 310 which is oriented substantially in parallel to the internal electric field 300 of the depletion region 320. The source-contact 110 is coupled to the source-layer 40. The drain-contact 120 is coupled to the drain-layer 50.

In at least one example the TFET 10 is configured so that the external electric field 310 is aligned substantially in parallel along the direction of the internal electric field 300 of the depletion region 320, so that tunneling from the source-tunneling-region 70 to the drain-tunneling-region 80 across the depletion region 320 is promoted, i.e., enhanced, relative to a configuration of the TFET 10 that has the external electric field 310 aligned non-parallel to the internal electric field 300 direction of the depletion region 320. It is believed that as a result of the external electric field 310 being aligned substantially in the same direction as that of the internal electric field 300 direction of the depletion region 320, then tunneling between the source-tunneling-region 70 and the drain-tunneling-region 80 is promoted substantially normal to a gate/dielectric-interface 270.

The internal electric field 300 of the depletion region 320 may arise from ionized dopants in the depletion region 320.

In at least one example the TFET 10 does not have an intrinsic layer between the source-tunneling-region 70 and the drain-tunneling-region 80.

In at least one example the gate-dielectric 90 of the TFET 10 is not interfaced across the depletion region 320.

In at least one example the gate-dielectric 90 of the TFET 10 is not directly contacted to the depletion region 320.

The source-layer 40 may comprise a p-type source-layer 40 and the drain-layer 50 may comprise an n-type drain-layer 50 such that the TFET 10 is an n-TFET 10. For example, one variant may be that the source-layer 40 comprises a p-doped $Al_xGa_{1-x}Sb$ source-layer 40 and the drain-layer 50 comprises an n-doped InAs drain-layer 50 wherein the subscript x is between 0 and 1. Yet another variant may be that the source-layer 40 comprises a p-doped InP source-layer 40 and the drain-layer 50 comprises an n-doped $In_xGa_{1-x}As$ drain-layer 50 wherein the subscript x is between 0 and 1. Another variation is that the source-layer 40 may comprise an n-type source-layer 40 and that the drain-layer 50 may comprise a p-type drain-layer 50 such that the TFET 10 is a p-TFET 10.

The source-layer 40 and the drain-layer 50 may comprise substantially the same type of semiconductor material but have different doping types that change their respective opposing electrical characteristics. Alternately the source-layer 40 and drain-layer 50 may comprise different types of semiconductor materials. Accordingly, the valence band edge 330 of the source-tunneling-region 70 and the conduction band edge 340 of the drain-tunneling-region 80 may be any position along the energetic profile. One variant of the material composition of the source-layer 40 and the drain-layer 50 is that the valence band edge 330 of the source-tunneling-region 70 is within about 100 meV that of the conduction band edge 340 of the drain-tunneling-region 80. Another variant is that the valence band edge 330 of the source-tunneling-region 70 substantially matches that of a conduction band edge 340 of the drain-tunneling-region 80. Some examples of the types of materials that make up the source-layer 40 and/or drain-layer 50 may comprise semiconductor compositions selected from the group consisting of Group III-V compositions, Group II-VI compositions, and Group IV compositions. Some specific examples of the types of materials that make up the source-layer 40 or drain-layer 50 may comprise semiconductor compositions selected from the group consisting of Si, C (diamond), C (graphene), Ge, SiC, SiGe, GaN, GaP, GaAs, AlP, AlAs, AlGaSb, AlN, InGaAs, GaSb, InAlN, InAs, InP, InN, InSb, CdS, CdSe, CdTe, $MoS_2$, $MoSe_2$, $MoTe_2$, $WS_2$, $WSe_2$, $WTe_2$, $TiO_2$, ZnO, ZnS, ZnSe, ZnTe, InGaN, InGaP, InGaAs, InAlN, InAlP, PbS, PbSe, PbTe, PbSeTe, PbSn, PbSnSeTe, PbCdSe, PbCdTe, PbCdSeTe, HgCdTe, MgZnSeTe, MgCdSSe, MgZnCdSe, MgTe, and mixtures thereof.

An optional substrate 20 may be added to the TFET 10. This optional substrate 20 either may be on the source-layer 40 or on the drain-layer 50. Some examples of the substrate 20 include those selected from the group consisting of a Si substrate 20, a GaAs substrate 20, a ZnO substrate 20, a Cu substrate 20, a W substrate 20, a Mo substrate 20, a GaP substrate 20, a GaN substrate 20, a SiC substrate 20, a buried oxide (BOX) substrate 20, a silicon on insulator (SOI) substrate 20, an InAs substrate 20, an InAlAs substrate 20, a InP substrate 20, a AlAs/AlSb superlattice (SL) buffer on GaSb substrate 20, a sapphire substrate 20, and mixtures thereof.

The gate-dielectric 90 may be composed of any known dielectric material such as those selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof. In at least one example the gate-dielectric 90 exhibits a dielectric constant greater than that of silicon oxide.

The gate 100 may be composed of any type of electrically conductive material such as those selected from the group consisting of aluminum, cobalt, copper, gold, hafnium, nickel, palladium, platinum, molybdenum, niobium, polysilicon, rhodium, silver, tantalum, tantalum nitride, tin, titanium nitride, titanium tungsten, tungsten, vanadium, zirconium, an electrically conductive polymer, and mixtures thereof.

In at least one example, an optional air-bridge 130 is included. One example of the optional air-bridge 130 is that it is positioned underneath the drain-layer 50 so as to substantially restrict the electrical conduction between the drain-layer 50 and the source-layer 40 through the drain-tunneling-region 80 and the source-tunneling-region 70. It will be noted that the air-bridge 130 does not necessarily have to comprise air. Accordingly, it is envisioned that in one example, the air-bridge 130 comprises any number of constituents that exhibit relatively non-conducting electrical properties. Accordingly, the air-bridge 130 may comprise any type of electrically non-conducting constituent such as those selected from the group consisting of a vacuum, air, an inert atmosphere, a passivation layer 260, and a dielectric.

An optional moat 140 may be built around the TFET 10 so as to substantially electrically isolate the TFET 10 away from adjacent neighboring electronic components and thus to substantially reduce cross-talk.

An optional passivation layer 260 may be added to the example in which the passivation layer 260 substantially covers TFET 10 to minimize environmental exposure degradation such as unwanted oxidation of the surfaces. Some examples of the passivation layer 260 comprise dielectric materials that are selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof.

Referring now to FIGS. 4A', 4A", 4B', 4B", 4C', 4C", 4D', 4D", 4E', 4E", 4F', 4F", 4G', 4G", 4H', and 4H", some of the steps in one example method of fabricating the TFET 10 of the present application are stylistically depicted as cross sectional side views with corresponding top views. This method of fabricating the TFET 10 comprises forming a layered structure 230 (FIGS. 4A' & 4A"), forming a gate 100 (FIGS. 4B' & 4B"), forming a gate-dielectric 90 (FIGS. 4C'&4C"), exposing a source-layer 40 (FIGS. 4D', 4D", 4E', & 4E"), forming selectively a source-contact 110 (FIGS. 4F' & 4F"), forming a drain-contact 120 (FIGS. 4F' & 4F"), forming at least one hole 250 FIGS. 4G'& 4G"), forming at least one air-bridge 130 (FIGS. 4H' & 4H"), and forming a moat 140 (FIGS. 4H' & 4H").

FIGS. 4A'& 4A" show forming the layered structure 230 comprising forming a source-layer 40 on a substrate 20; a drain-layer 50 directly on top of the source-layer 40; and a dielectric-layer directly on top of the drain-layer 50. FIGS. 4B'& 4B" show forming the gate 100 comprising forming the gate 100 directly on top the dielectric-layer such that the gate 100 defines a source-side 150 and a drain-side 160 of the layered structure 230. FIGS. 4C' & 4C" show forming the gate-dielectric 90 comprising forming the dielectric-layer between the gate 100 and the drain-layer 50 that exposes the drain-layer 50 at both the source-side 150 and at the drain-side 160 by selectively removing a portion of the dielectric-layer from both the source-side 150 and the drain-side 160. FIGS. 4D', 4D", 4E', & 4E" show exposing the source-layer 40 comprising exposing the source-layer 40 by selectively removing a portion of the drain-layer 50 from the source-side 150 by using a lithographic mask 240. FIGS. 4F'& 4F" show forming the source-contact 110 comprising forming selectively a source-contact 110 onto a portion of the exposed source-layer 40 at the source-side 150. FIGS. 4E', 4E", 4F'& 4F" show forming the drain-contact 120 which comprises forming a drain-contact 120 onto the drain-layer 50 at the drain-side 160. FIGS. 4G'& 4G" show forming the hole 250 comprising forming at least one hole 250 through the drain-layer 50 by selectively etching a portion of the drain-layer 50 away from the drain-side 160 that exposes a portion of the source-layer 40 at the drain-side 160 that underlies between the gate 100 and the drain-contact 120. FIGS. 4H'& 4H" show forming the air-bridge 130 comprising forming at least one air-bridge 130 by selectively undercutting a portion of the underlying source-layer 40 at the drain-side 160 by using a lithographic mask 240. FIGS. 4H'& 4H" also show forming the moat 140 comprising forming the moat 140 around the TFET 10 by selectively eliminating portions of the drain-layer 50 and the source-layer 40 around the TFET 10. A portion of the drain-layer 50 and a portion of the source-layer 40 vertically underneath the gate 100 and the gate-dielectric 90 respectively comprise a source-tunneling-region 70 and a drain-tunneling-region 80. The source-tunneling-region 70 and drain-tunneling-region 80 form a depletion region 320 which exhibits an internal electric field 300 that substantially points towards the source-tunneling-region 70 and drain-tunneling-region 80 when no external electric field 310 is imposed. The gate 100 is configured to impose an external electric field 310 which is oriented substantially in parallel to the internal electric field 300 of the depletion region 320.

The air-bridge 130 and the moat 140 formed by this method may be formed simultaneously or in separate steps. The example air-bridge 130 physically separates and electrically isolates that portion of the source-layer 40 underneath the air-bridge 130 away from that portion of the source-layer 40 which is underneath the source-contact 110 and the gate 100. The present method may result in building the moat 140 all around the TFET 10 so as to substantially electrically isolate the TFET 10 away from adjacent neighboring electronic components and thus substantially reduces cross-talk. In this example method, the method results in forming the air-bridge 130 positioned underneath the drain-layer 50 so as to substantially restrict, the electrical conduction between the drain-layer 50 and the source-layer 40 through the drain-tunneling-region 80 and the source-tunneling-region 70. It will be recognized that the air-bridge 130 does not necessarily comprise air. Accordingly, it is envisioned that the air-bridge 130 can comprise any number of different types of constituents which are relatively electrically non-conducting. Accordingly, the air-bridge 130 may comprise any type of electrically non-conducting constituent such as those selected from the group consisting of a vacuum, air, an inert atmosphere, a passivation layer 260, and a dielectric.

This example method may also optionally include in the layered structure 230 a superlattice buffer 30 between the substrate 20 and the source-layer 40.

In one example, the method results in a TFET 10 that does not comprise an intrinsic layer between the source-layer 40 and the drain-layer 50.

In one example, the method results in a TFET 10 that does not comprise a gate-dielectric 90 interfaced across the depletion region 320.

In one example, the method results in a TFET 10 that does not comprise a gate-dielectric 90 directly contacted to the depletion region 320.

This example method may include at least one of the source-layer 40 or the drain-layer 50 to comprise substantially the same identical semiconductor material but have different doping types that change their respective opposing electrical characteristics. Alternately the source-layer 40 and drain-layer 50 may comprise different types of semiconductor materials. Some examples of the types of materials that make up the source-layer 40 and/or drain-layer 50 may comprise semiconductor compositions selected from the group consisting of Group III-V compositions, Group II-VI compositions, and Group IV compositions. Some specific examples of the types of materials that make up the source-layer 40 or drain-layer 50 may comprise semiconductor compositions selected from the group consisting of Si, C (diamond), C (graphene), Ge, SiC, SiGe, GaN, GaP, GaAs, AlP, AlAs, AlGaSb, AlN, InGaAs, GaSb, InAlN, InAs, InP, InN, InSb, CdS, CdSe, CdTe, $MoS_2$, $MoSe_2$, $MoTe_2$, $WS_2$, $WSe_2$, $WTe_2$, $TiO_2$, ZnO, ZnS, ZnSe, ZnTe, InGaN, InGaP, InGaAs, InAlN, InAlP, PbS, PbSe, PbTe, PbSeTe, PbSn, PbSnSeTe, PbCdSe, PbCdTe, PbCdSeTe, HgCdTe, MgZnSeTe, MgCdSSe, MgZnCdSe, MgTe, and mixtures thereof.

This example method may result in the source-layer 40 comprising a p-type source-layer 40 and the drain-layer 50 comprising an n-type drain-layer 50 such that the TFET 10 is an n-TFET 10. For example, one variant may be that the source-layer 40 comprises a p-doped $Al_xGa_{1-x}Sb$ source-layer 40 and the drain-layer 50 comprises an n-doped InAs drain-layer 50 wherein the subscript x is between 0 and 1. Yet another variant may be that the source-layer 40 comprises a p-doped InP source-layer 40 and the drain-layer 50 comprises an n-doped $In_xGa_{1-x}As$ drain-layer 50 wherein the subscript x is between 0 and 1. Another variation is that the source-layer 40 may comprise an n-type source-layer 40 and that the drain-layer 50 may comprise a p-type drain-layer 50 such that the TFET 10 is a p-TFET 10.

This example method may include at least one of the forming steps a semiconductor fabrication technique selected from the group consisting of chemical vapor deposition (CVD), low pressure CVD (LPCVD), atmospheric pressure CVD (APCVD), ultrahigh vacuum CVD (UHVCVD, atomic layering deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, masking lithography, and chemical mechanical polishing (CMP).

This example method may also further include forming a passivation layer 260 covering over the TFET 10. The passivation layer 260 may be any dielectric material such as those is selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof.

Figure 5A:
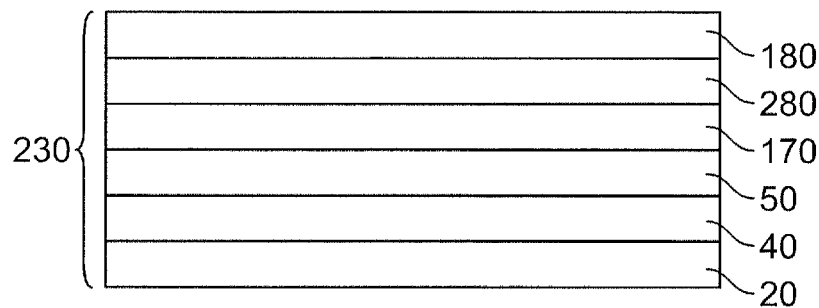
FIGS. 5a-i, depict cross sectional side views of some of the steps in fabricating the example TFET of the present application are depicted.
Figure 5B:
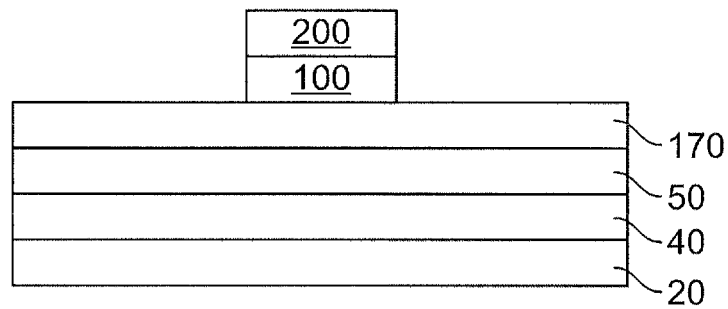
Figure 5C:
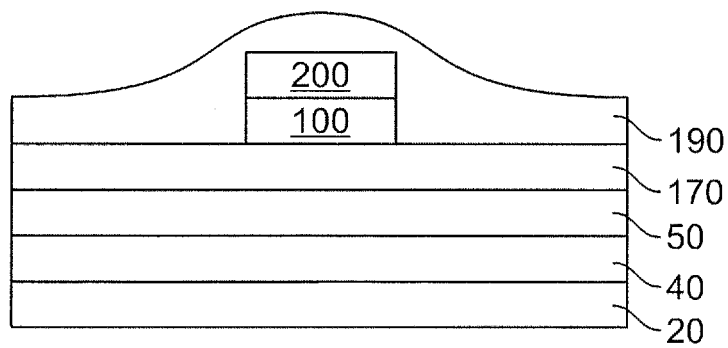
Figure 5D:
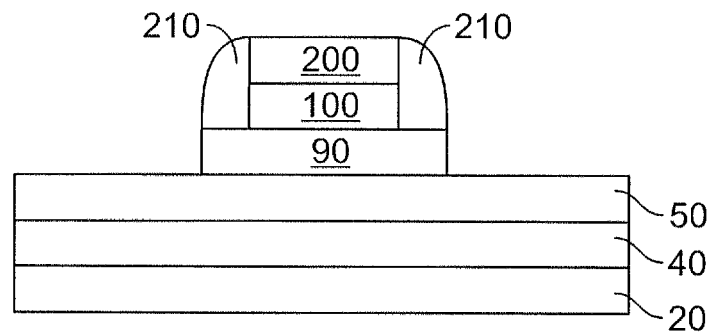
Figure 5E:
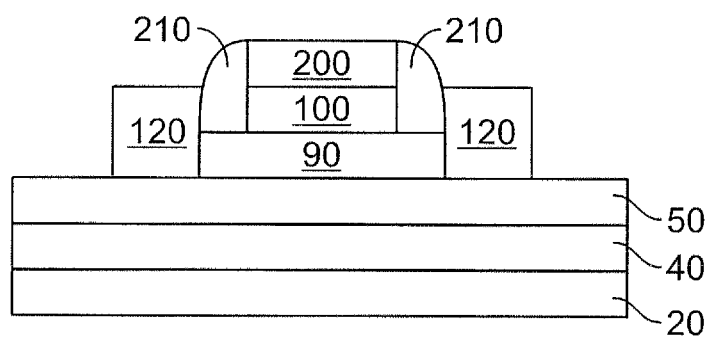
Figure 5F:
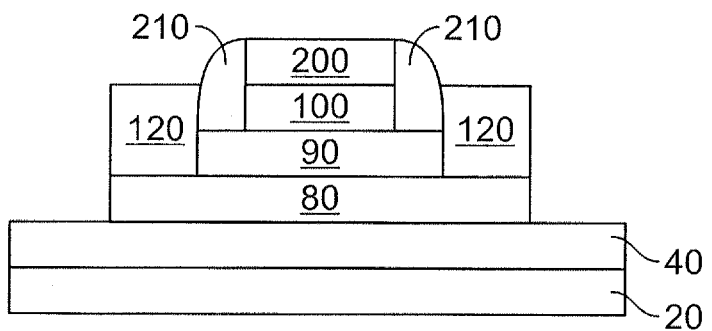
Figure 5G:
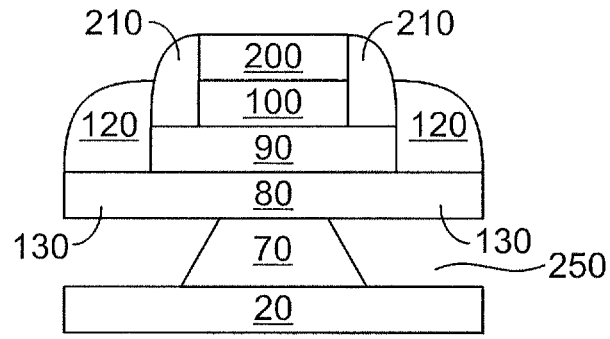
Figure 5H:
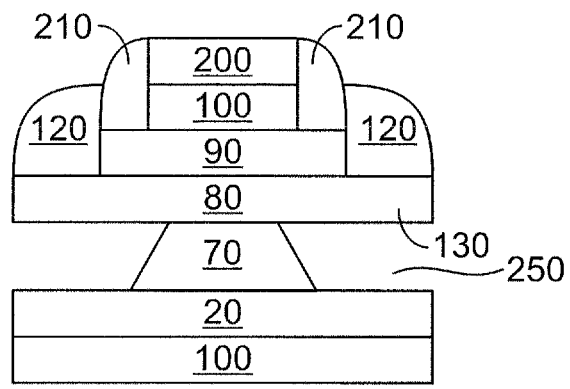

Referring now to FIG. 5a-I, some of the steps in another example method of fabricating the TFET 10 of the present application are stylistically depicted as cross sectional side views. This method of fabricating a TFET 10 comprises forming a multi-layered structure 230 (FIG. 5a), forming a dielectric-cap 200 (FIG. 5b), forming a third dielectric-layer 190 (FIG. 5c), forming self-aligning dielectric-sidewalls 210 (FIG. 5c), forming a gate-dielectric 90 (FIG. 5d), forming a drain-contact 120 (FIG. 5e), forming a drain-tunneling-region 80 (FIG. 5f), forming a source-tunneling-region 70 (FIG. 5g), and forming a source-contact 110 (FIG. 5h).

Figure 5I:
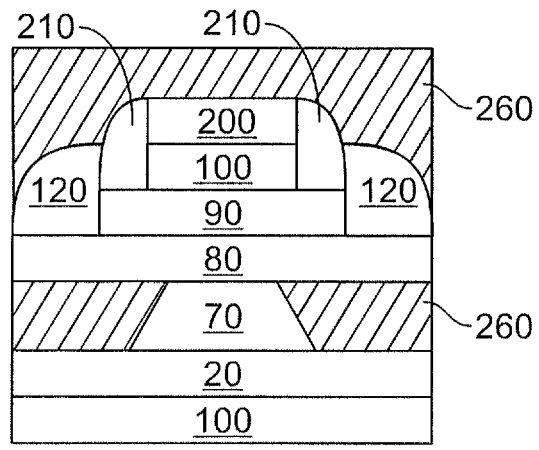

FIG. 5a depicts forming the multi-layered structure 230 that comprises forming source-layer 40 on a substrate 20; a drain-layer 50 directly on top of the source-layer 40; a first dielectric-layer 170 directly on top of the drain-layer 50; a gate-layer 280 directly on top of the first dielectric-layer 170; and a second dielectric-layer 180 directly on top of the gate-layer 280. FIG. 5b depicts forming the dielectric-cap 200 that comprises forming the dielectric-cap 200 directly on top of a gate 100 and expose the drain-layer 50 adjacent to the gate 100 by selectively removing a portion of the second dielectric-layer 180 and a portion of the gate-layer 280. FIG. 5c depicts forming the third dielectric-layer 190 that comprises forming a third dielectric-layer 190 directly on top of the dielectric-cap 200 and directly on top of the exposed firstdielectric-layer. FIG. 5d depicts forming the self-aligning dielectric-sidewalls 210 that comprises forming self-aligning dielectric-sidewalls 210 adjacent to the gate 100 from the third-dielectric-layer by selectively removing portions of the third dielectric-layer 190. FIG. 5e depicts forming the gate-dielectric 90 that comprises forming a gate-dielectric 90 from the first dielectric-layer 170 which is vertically underneath the gate 100 and the self-aligning dielectric-sidewalls 210 by selectively removing portions the first dielectric-layer 170 that are not underneath the gate 100 and the self-aligning dielectric-sidewalls 210 and to expose the drain-layer 50 adjacent to the gate 100 and at opposing edges 220 of the structure 230. FIG. 5f depicts forming a drain-contact 120 that comprises forming the drain-contact 120 onto the drain-layer 50 adjacent to the gate 100 while leaving the drain-layer 50 exposed at the opposing edges 220. FIG. 5g depicts forming a drain-tunneling-region 80 that comprises forming the drain-tunneling-region 80 from the drain-layer 50 which is vertically underneath the gate 100 by selectively removing portions of the drain-layer 50 at the opposing edges 220 to expose the source-layer 40. FIG. 5h depicts forming the source-tunneling-region 70 that comprises forming the source-tunneling-region 70 from the source-layer 40 which is vertically underneath the drain-tunneling-region 80 by selectively etching the source-layer 40 to remove the exposed source-layer 40 at the opposing edges 220 and to remove portions of the source-layer 40 underneath the drain-layer 50 for form an air-bridge 130. FIG. 5i depicts forming a source-contact 110 that comprises forming a source-contact 110 onto the substrate 20 that electrically couples to the source-tunneling-region 70.

This present method example may also comprise an optional step (FIG. 3b) of removing a portion of the dielectric-cap 200 from the gate 100 to enable electrical connection to the gate 100 may be included.

This present method example may result in the gate 100 together with the self-aligning dielectric-sidewalls 210, i.e., the total width of the gate 100 and the width of the self-aligning dielectric-sidewalls 210, being wider than the source-tunneling region which is in direct contact with the gate-dielectric 90. In one example, the width of the gate 100 is wider than the width of the source-tunneling region which is in direct contact with the gate-dielectric 90.

This present method example may result in fabricating a TFET 10 having the source-tunneling-region 70 and drain-tunneling-region 80 that form a depletion region 320 which exhibits an internal electric field 300 that substantially points towards the source-tunneling-region 70 and drain-tunneling-region 80 when no external electric field 310 is imposed. This method may also result in configuring the gate 100 so that it imposes a external electric field 310 which is oriented substantially in parallel to the internal electric field 300 of the depletion region 320.

The present method example may form the self-aligned dielectric sidewalls and the gate-dielectric 90 separately or form the self-aligned dielectric sidewalls and the gate-dielectric 90 simultaneously.

The present method example may form the drain-contact 120 onto the drain-layer 50 adjacent to the gate 100 and form portions of the drain-contact 120 onto portions of the dielectric-cap 200 at separate steps or simultaneously. Also the present method example may result a TFET 10 having self-aligned drain-contacts 120.

This present method example may include forming steps that comprises at least one of the semiconductor fabrication techniques selected from the group consisting of chemical vapor deposition (CVD), low pressure CVD (LPCVD), atmospheric pressure CVD (APCVD), ultrahigh vacuum CVD (UHVCVD, atomic layering deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, masking lithography, and chemical mechanical polishing (CMP).

This present method example may result in fabricating a TFET 10 device that exhibits a promotion or enhancement of tunneling current effect between the source-tunneling-region 70 and the drain-tunneling-region 80 substantially normal to a gate/dielectric-interface 270 as compared to those TFETs 10 that are not configured to have their gate/gate-dielectric 90/drain-tunneling-region 80/source-tunneling-region 70 in-line with each other.

In one instance, the example method may result in a TFET 10 that does not comprise an intrinsic layer between the source-layer 40 and the drain-layer 50.

In one instance, the example method may result in a TFET 10 that does not comprise a gate-dielectric 90 interfaced across the depletion region 320.

In one instance, the example method may result in a TFET 10 that does not comprise a gate-dielectric 90 directly contacted to the depletion region 320.

The present method example may form at least one of the first dielectric-layer 170, the second dielectric-layer 180 or the third dielectric-layer 190 from a material composition selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof. In at least one example the first dielectric-layer 170, the second dielectric-layer 180 and the third dielectric-layer 190 exhibit a dielectric constant greater than that of silicon oxide.

The present method example may result in the source-layer 40 comprising a p-type source-layer 40 and the drain-layer 50 comprising an n-type drain-layer 50 such that the TFET 10 is an n-TFET 10. For example, one variant may be that the source-layer 40 comprises a p-doped $Al_xGa_{1-x}Sb$ source-layer 40 and the drain-layer 50 comprises an n-doped InAs drain-layer 50 wherein the subscript x is between 0 and 1. Yet another variant may be that the source-layer 40 comprises a p-doped InP source-layer 40 and the drain-layer 50 comprises an n-doped $In_xGa_{1-x}As$ drain-layer 50 wherein the subscript x is between 0 and 1. Another variation is that the source-layer 40 may comprise an n-type source-layer 40 and that the drain-layer 50 may comprise a p-type drain-layer 50 such that the TFET 10 is a p-TFET 10.

The present method example may result in forming a TFET 10 with at least one of the source-layer 40 or the drain-layer 50 to comprise substantially the same identical semiconductor material but have different doping types that change their respective opposing electrical characteristics. Alternately the source-layer 40 and drain-layer 50 may comprise different types of semiconductor materials. Some examples of the types of materials that make up the source-layer 40 and/or drain-layer 50 may comprise semiconductor compositions selected from the group consisting of Group III-V compositions, Group II-VI compositions, and Group IV compositions. Some specific examples of the types of materials that make up the source-layer 40 or drain-layer 50 may comprise semiconductor compositions selected from the group consisting of Si, C (diamond), C (graphene), Ge, SiC, SiGe, GaN, GaP, GaAs, AlP, AlAs, AlGaSb, AlN, InGaAs, GaSb, InAlN, InAs, InP, InN, InSb, CdS, CdSe, CdTe, $MoS_2$, $MoSe_2$, $MoTe_2$, $WS_2$, $WSe_2$, $WTe_2$, $TiO_2$, ZnO, ZnS, ZnSe, ZnTe, InGaN, InGaP, InGaAs, InAlN, InAlP, PbS, PbSe, PbTe, PbSeTe, PbSn, PbSnSeTe, PbCdSe, PbCdTe, PbCdSeTe, HgCdTe, MgZnSeTe, MgCdSSe, MgZnCdSe, MgTe, and mixtures thereof.

The present method example may result in forming a TFET 10 comprising a substrate 20 which is selected from the group consisting of a Si substrate 20, a GaAs substrate 20, a GaSb substrate 20, a ZnO substrate 20, a Cu substrate 20, a W substrate 20, a Mo substrate 20, a GaP substrate 20, a GaN substrate 20, a SiC substrate 20, a buried oxide (BOX) substrate 20, a silicon on insulator (SOI) substrate 20, an InAs substrate 20, an InAlAs substrate 20, an InP substrate 20, a AlAs/AlSb superlattice (SL) buffer on GaSb substrate 20, a sapphire substrate 20, and mixtures thereof.

An optional step of forming a passivation layer 260 covering over the TFET 10 may be included so that the resultant TFET 10 does not degrade due to unwanted exposure to extraneous environmental exposure. Some examples of compositions that can make up the passivation layer 260 comprises a dielectric material selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof.

As shown in FIG. 6a the heterojunction device layers of the TFET 10 were grown by molecular-beam epitaxy (MBE). In this example, the interband tunnel junction consists of Si-doped n-InAs on Be-doped p+$Al_{0.45}Ga_{0.55}Sb$, on an n-GaSb substrate 20. FIG. 6b outlines the process flow and FIG. 6c shows a stylized cross section of some of the major constituents of the TFET 10. In this transistor geometry the drain-contact 120 is isolated from the p+ source-contact 110 and from the source-layer 40 on the source side. This is achieved by undercutting the n-InAs layer to form an InAs air-bridge 130 that limits electrical communications between the drain-contact 120 and the source-contact 110 through the p-n tunnel junction 60.

Figure 7A:
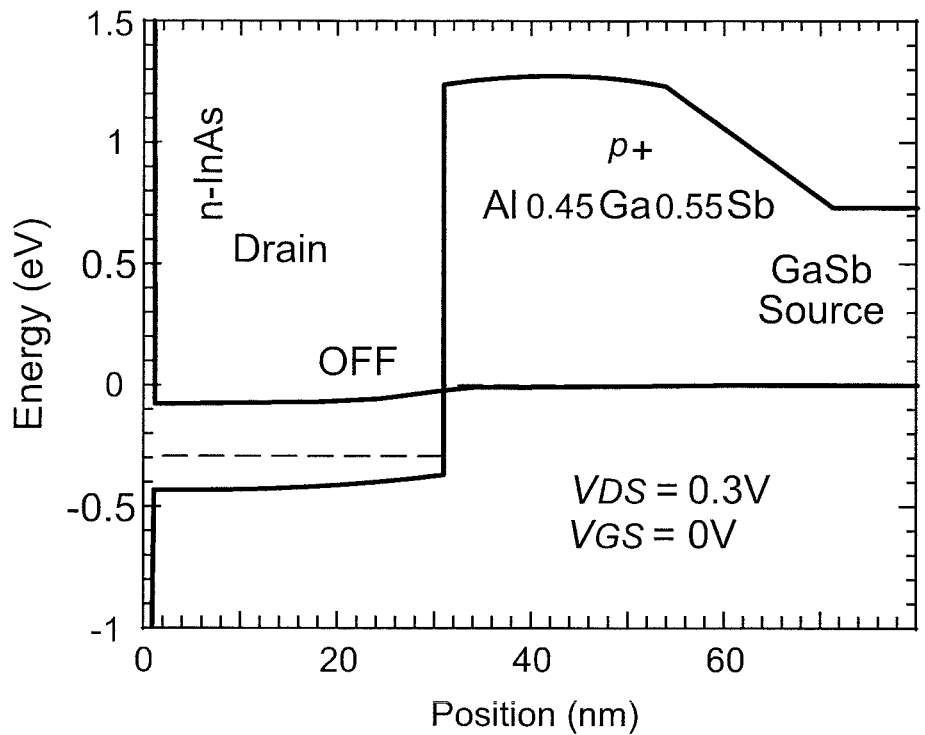
FIGS. 7a-b depict (a) off and (b) on-state energy band diagrams, respectively, from the gate oxide normal to the surface through the near-broken-gap InAs/AlGaSb heterojunction TFET.
Figure 7B:
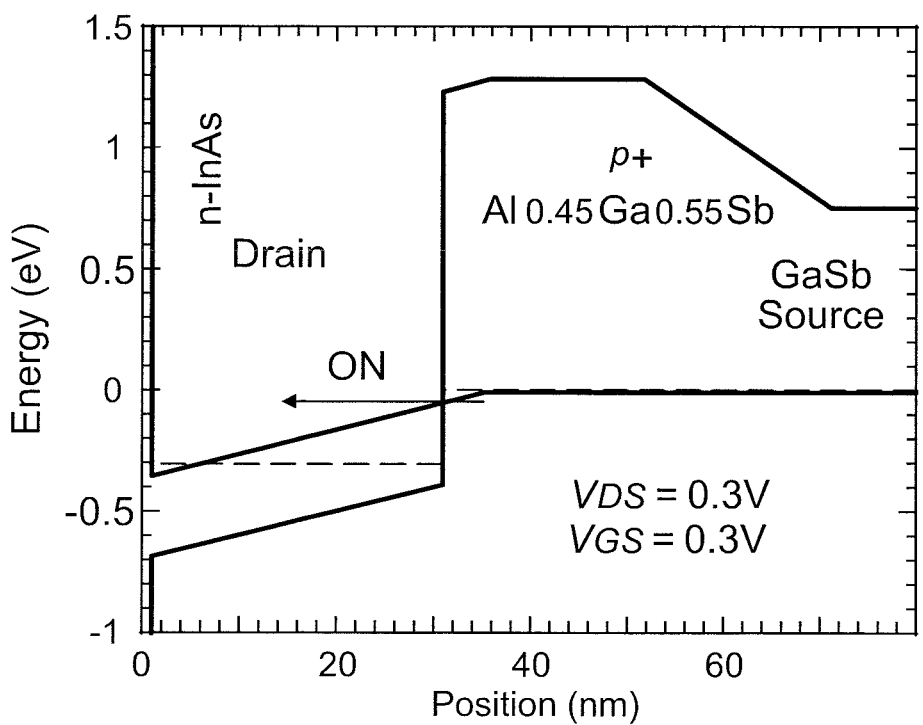

The band diagrams of the heterojunction TFET 10 in both off and on-states were simulated using a one-dimensional Poisson solver. In the off-state, FIG. 7a, with $V_{GS}$=0 V, there is no tunneling window and thus the TFET 10 is turned off. While in the on-state, FIG. 7b, with $V_{GS}$=0.3 V, electrons can tunnel from the valence band of the p+$Al_{0.45}Ga_{0.55}Sb$ source to the conduction band of the n-InAs drain at the interband tunnel junction.

The TFET 10 device fabrication uses four electron-beam lithography (EBL) steps and two lift-off metallizations. The first step in the process is to deposit a 7 nm Al2O3 as gate-dielectric 90 on the InAs drain-layer 50. The top surface of the TFET 10 device layers is delivered with a 3 nm undoped GaSb cap (not shown) which is removed by selective etching in 1$NH_4OH$:5$H_2O$ for 10 s just prior to loading into an atomic layer deposition (ALD) system. Trimethylaluminum is used as the source at a pressure of 300 mTorr; the substrate 20 temperature was 300° C. The first metal lift-off forms the gate 100. The source and drain metallization are formed in the same evaporation step on surfaces that have been prepared by selective etching.

Selected portion of the $Al_2O_3$ gate-dielectric 90 are removed from the InAs drain-layer 50 surface using a in 10% buffered HF for 10 s. The InAs drain-layer 50 is selectively removed over the AlGaSb source-layer 40 in 1$C_6H_8O_7$:1$H_2O_2$ for 45 s. The InAs air-bridges 130 are formed by etching the (Al)GaSb from under the InAs drain-layer 50. This etch is also done selectively by etching in 1$NH_4OH$:5$H_2O$ for 60 s. InAs air-bridges 130 are formed in parallel by undercutting 30 nm of InAs drain-layer 50 capped by poly (methyl methacrylate) (PMMA) with a bridge width of 300 nm and a bridge length of 1000 nm. FIG. 8 shows a scanning electron micrograph (SEM) of InAs air-bridges 130 where the undercut is clearly seen by the contrast differences apparent approximately 500 nm from the edge of the etch openings.

Figures 9A, 9B:
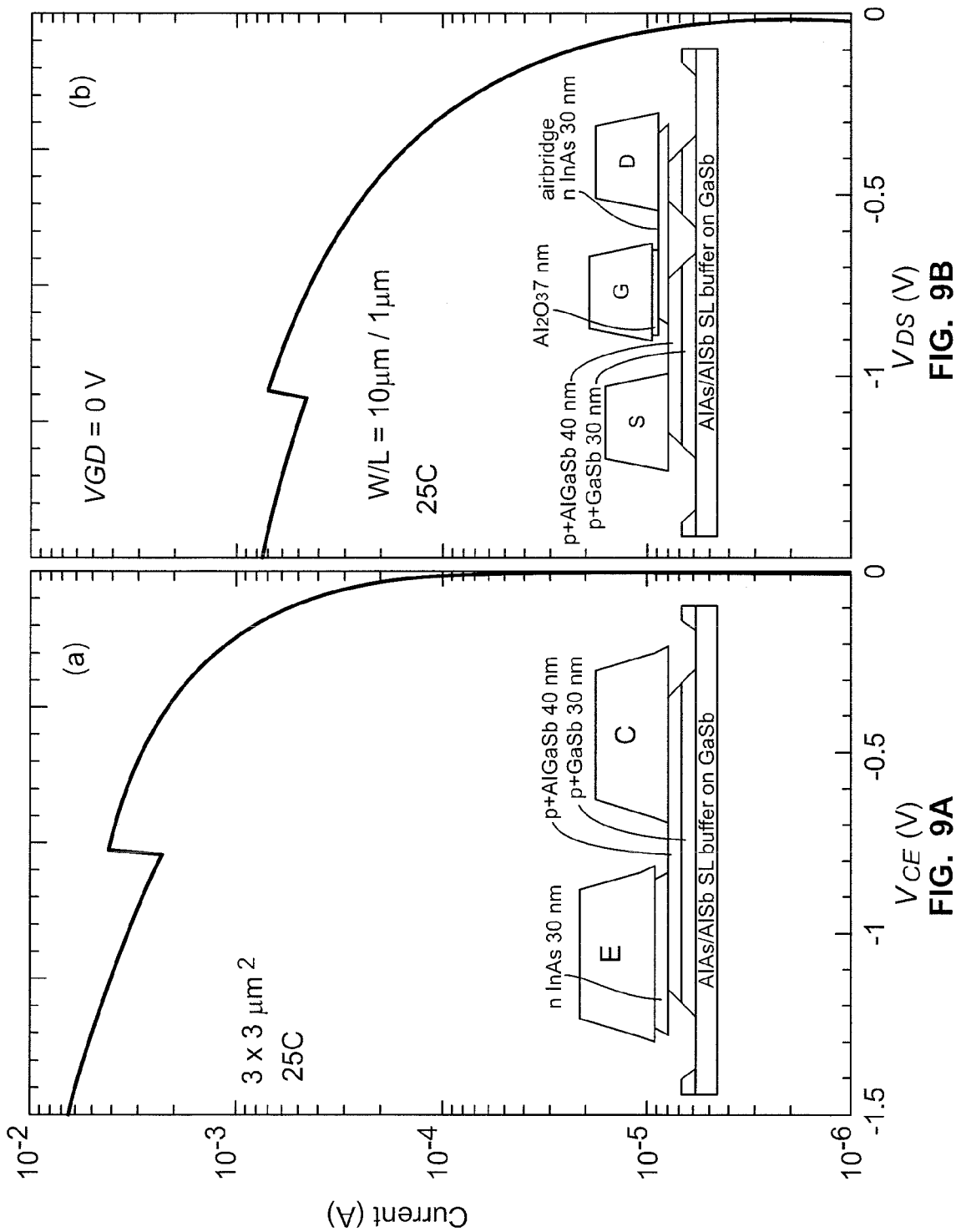
FIGS. 9a-b are measured I-V curves of (a) a tunneling diode and (b) a TFET of the present application with reverse $V_{DS}$ bias.

The measured current-voltage (I-V) characteristic of the InAs/AlGaSb tunnel junction TFET 10 is shown in FIG. 9a in the Esaki forward-bias direction in a vertical diode 290 geometry. A peak current density of 0.46 mA/$\mu m^2$ and a peak-to-valley current ratio (PVR) of 1.8 are achieved in the diode 290. The negative differential resistance (NDR) confirms that transport prior to the peak current is by band-to-band tunneling. In the TFET 10, FIG. 9b, the NDR is also apparent as shown in FIG. 9b with reverse $V_{DS}$ bias. The different apparent peak current densities in the two devices may be explained by a higher etch undercut in the TFET 10 relative to the diode 290.

FIG. 10 shows the simulated I-V characteristics of the vertical InAs/AlGaSb TFET 10 predicts an on current of 750 $\mu$A/$\mu$m on current at 1 V and slightly less than 60 mV/decade subthreshold swing at low drain currents. The subthreshold swing increases with equivalent oxide thickness (EOT) of the gate 100 dielectric and thickness of the InAs layer. In this first fabrication example, a relatively thick gate-dielectric 90 oxide (7 nm and EOT of 3 nm) is chosen to make gate 100 leakage negligible and a 30 nm thick InAs drain-layer 50 is chosen so that the air-bridge 130 would yield on the first pass. Lower subthreshold swing (SS) should result with further optimization of these relative thickness and sizing.

The measured common-source characteristics are shown in FIG. 11 in log and linear $I_D$-$V_{GS}$ plots at two temperatures, 25 and −50° C. The transistor on-state current of 21 $\mu$A/$\mu$m at room temperature is reduced from the predictions by the source and drain access resistances. The source contact resistance is 3×$10^{-4}$ Ω·$\mu m^2$ and sheet resistance of 1700Ω/□ measured on transmission line test (TLM) structures 230. The drain access resistance is 400Ω/□ also measured on TLM. The high source-contact 110 resistance is not so surprising since the AlGaSb may be expected to oxidize prior to contact deposition. The temperature dependence of the source-contact 110 resistance is likely responsible for the on-current decrease in the transistor characteristics as the temperature is reduced from room temperature −50° C. The stretch-out in the characteristic is due to a high Al$_2$O$_3$/InAs interface trap density which is shown by capacitance-voltage measurements. A simple $C_{OX}V_{GS}$ estimate of the charge ($C_{OX}$=12 µF/cm$^2$ and $V_{GS}$3=V) shows that an interface charge density of 2×10$^{14}$/cm$^2$ would account for the observed stretch-out.

Figure 12:
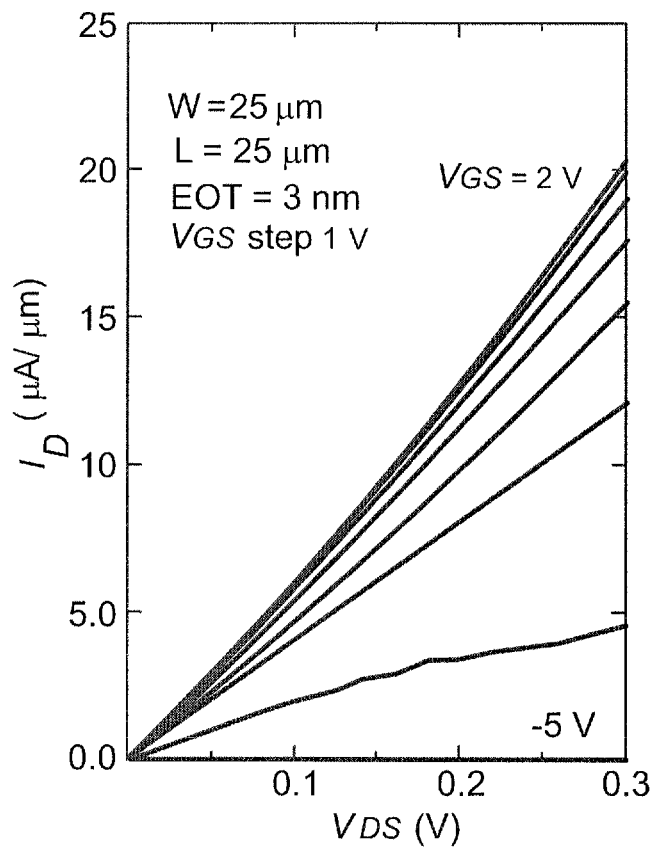
FIG. 12 is measured common-source characteristics ID-VDS of the InAs/AlGaSb TFET of the present application.

Shown in FIG. 12 are the common-source characteristics in the bias range of interest for TFETs 10. The characteristics are nonsaturating in this range due to the parasitic source resistance.

Figure 13:
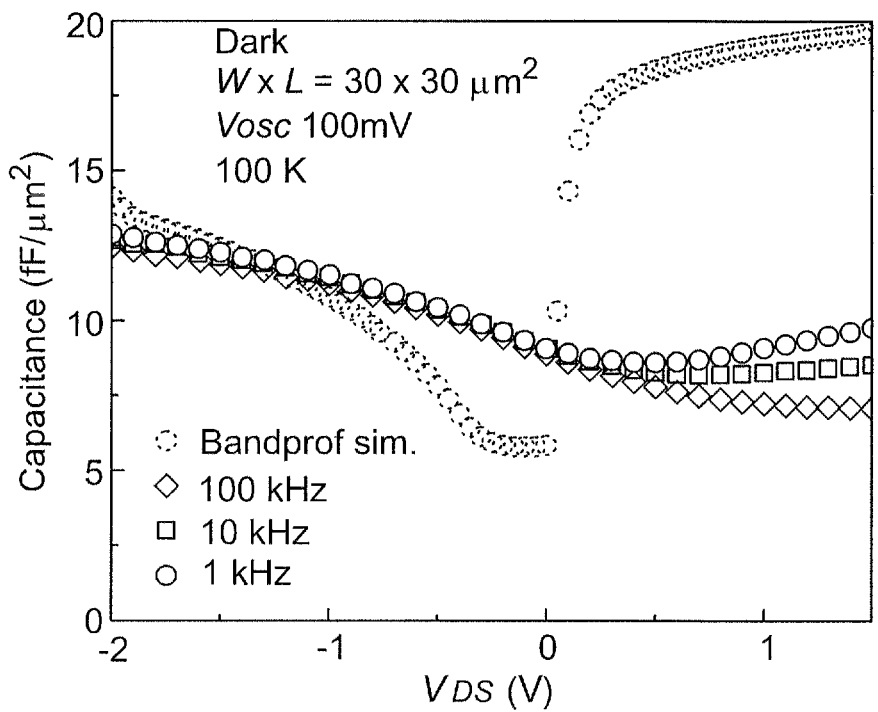
FIG. 13 is measured gate-drain C-V characteristics for selected frequencies and compared to the simulated characteristics.

The measured capacitance-voltage (C-V) characteristics is compared in FIG. 13 with a simulated characteristic at a temperature of 100 K. The measured C-V shows a high stretch-out in the accumulation region also consistent with a high interface trap density, D$_{it}$.

Figure 14:
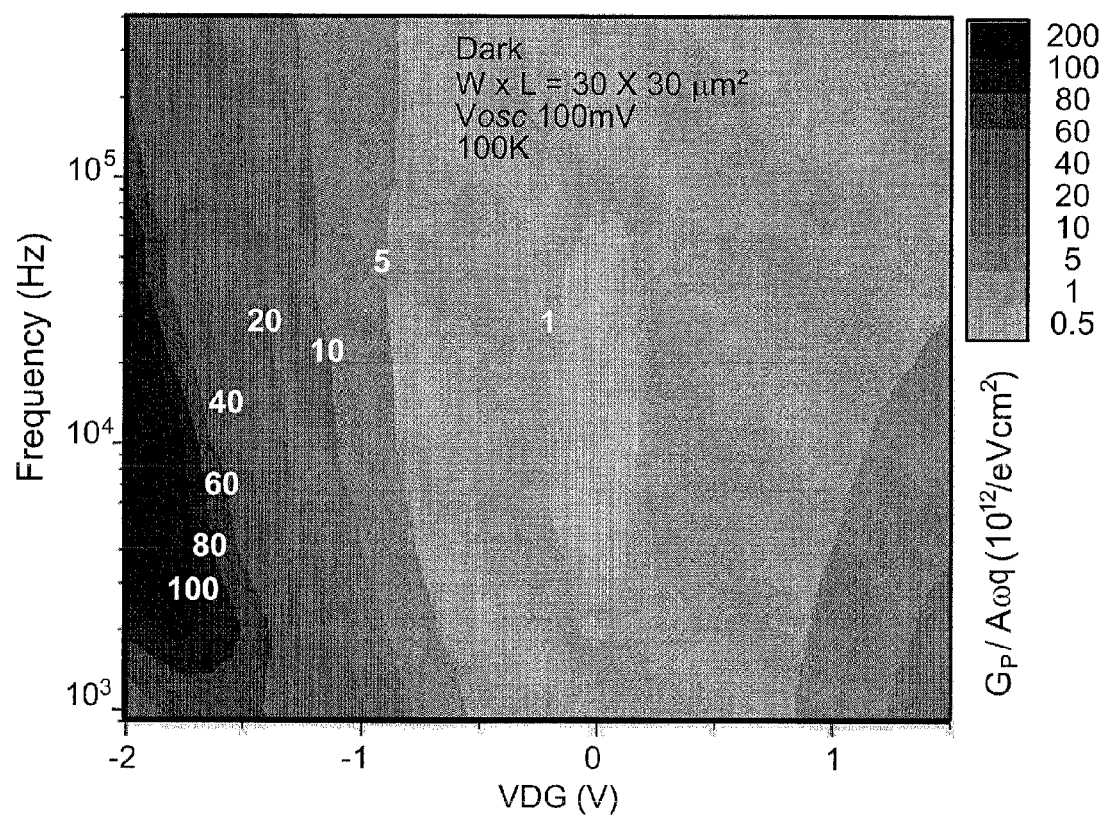
FIG. 14 depicts a contour plot of the conductance method for interface trap density ($D_{it}$) extraction as a function of frequency and bias dependence.

FIG. 14 depicts frequency and bias dependence of the interface trap density Dit=GP/(Aω q) determined from parallel interface conductance GP, computed from the real part of the two-terminal MOS diode 290 impedance. The other symbols are device area A in cm$^2$, angular frequency ω=2πf in radians/s, impedance measurement frequency f in Hz, and fundamental electron charge q in C. This shows the contour plot of the conductance method for interface trap density (D$_{it}$) extraction, disclosing a trap density to be as high as 10$^{14}$/eV cm$^2$. It confirms that the subthreshold swing and the ON/OFF ratio are limited by the high interface trap density.

In summary, an InAs/Al$_{0.45}$Ga$_{0.55}$Sb TFET 10 example is demonstrated in a new geometry with tunneling in-line with the gate 100 field. Comparison of measured and simulated characteristics show that the intrinsic performance is masked by a high source-contact 110 resistance to p-AlGaSb and a high interface trap density. At room temperature, the on-state current is 21 µA/µm at 0.3 V. An ON/OFF current ratio of 10$^3$ and 570 mV/decade subthreshold swing were achieved at −50° C.

Figure 15A:
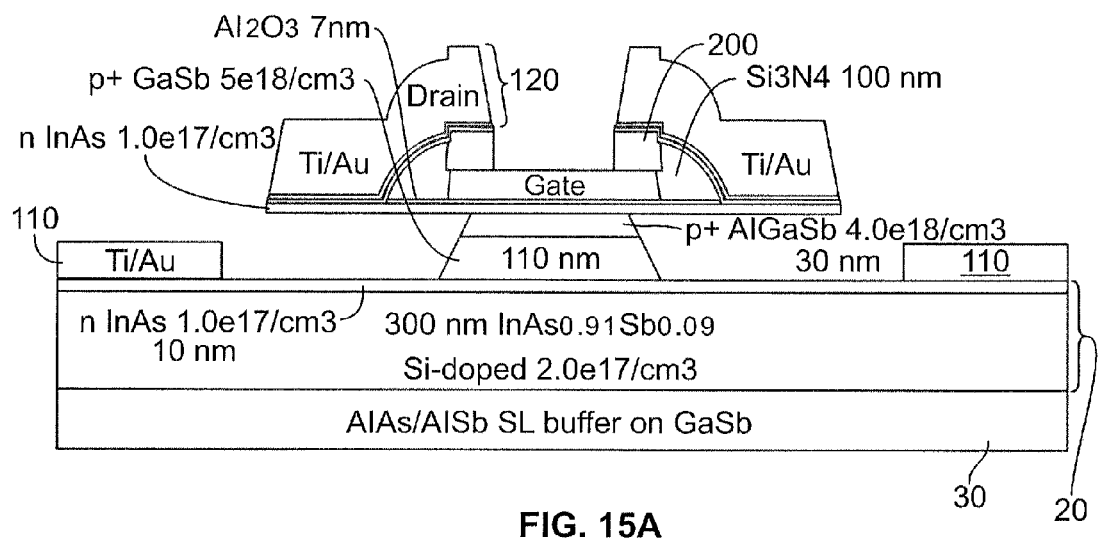
FIGS. 15a-b depict (a) a stylized cross section and (b) a FIB/SEM cross-sectional image of an InAs/Al$_{0.45}$Ga$_{0.55}$Sb TFET fabricated using a gate first self-aligned process.
Figure 15B:
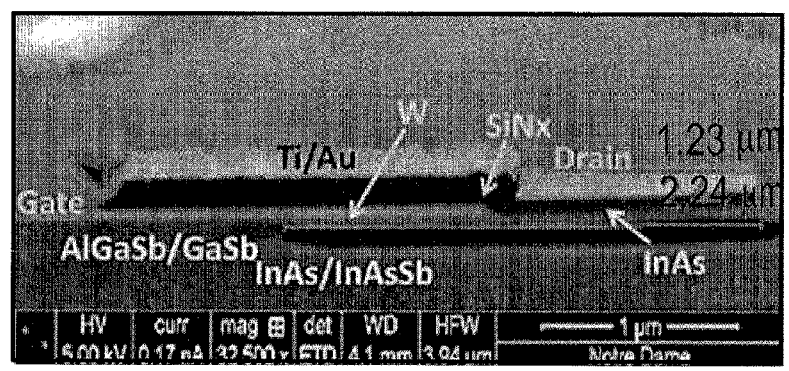

FIG. 15a shows a cross section of the n-channel InAs/Al$_{0.45}$Ga$_{0.55}$Sb TFET 10 in a new tunneling geometry with the tunnel transport directed normal to the gate 100. The TFETs 10 were grown using a molecular beam epitaxy (MBE) on a GaSb substrate 20. The epitaxial structure 230, starting from the substrate 20, consists of: 200 nm AlSb/AlAs superlattice buffer 30 layer, 300 nm of n+InAs$_{0.91}$Sb$_{0.09}$, 10 nm of n-InAs (Si-doped, 1×10$^{17}$ cm$^{-3}$), a 110 nm thick p+GaSb and a 30 nm of p+Al$_x$Ga$_{1-x}$Sb (Be-doped, 4×10$^{18}$ cm$^{-3}$) comprising the source-layer 40, with the Al composition x increased in three steps from 0 to 0.45, and concluding with a top 30 nm n-InAs layer (Si-doped, 1×10$^{17}$ cm$^{-3}$) drain-layer 50. Three samples were processed; for one sample TFETs 10 were fabricated on the heterostructures 230 as grown, while in the other two the top InAs layer was thinned using Citric acid:H$_2$O$_2$ (1:1) to 22 nm and 15 nm thickness, respectively. A 7 nm thick Al$_2$O$_3$ gate-dielectric 90 was deposited by atomic layer deposition (ALD) immediately after cleaning in 1HCl:1H$_2$O for 30 s. A Ti/W/SiN$_x$ gate 100 stack was blanket-deposited, then patterned using optical lithography, and reactive-ion etched (RIE). Plasma-enhanced chemical vapor deposition (PECVD) SiN$_x$ sidewalls were then formed around the gate 100, followed by removal of Al$_2$O$_3$ gate-dielectric 90 using a photoresist developer (i.e., AZ 400K™ which is a lithographic developer product that is trade secret material protected comprising a mixture of potassium hydroxide, water, and potassium borate). After drain metallization and lift-off (Ti/Au), InAs drain-layer 50 was selectively etched in 1 citric acid:1H$_2$O$_2$, followed by a selective etch of the AlGaSb source-layer 40 using tartaric acid: H$_2$O$_2$:HCl:H$_2$O (3.75 g:4 ml:40 ml:400 ml) until the AlGaSb source-layer 40 under the drain-layer 50 and the SiN$_x$ spacer was removed, forming the undercut mesa structure 230 having the air-bridge 130. FIG. 15b shows a cross sectional image of the fabricated InAs/AlGaSb vertical TFET 10, taken after cross sectioning in a focused-ion beam and imaging by scanning electron microscopy (FIB/SEM). The SEM images clearly indicate that the InAs/AlGaSb tunnel junctions were fully overlapped by the gate 100 electrode.

Figure 16A:
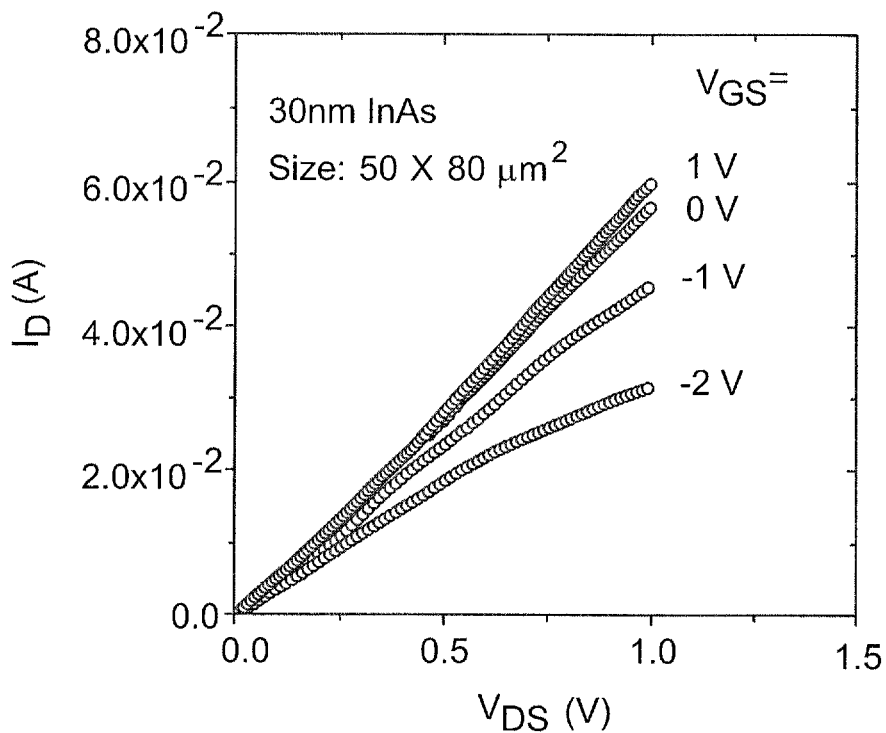
FIGS. 16a-c depict ID-VDS for (a) a 30-nm-thick InAs (b) a 22-nm thick InAs, and (c) a 15-nm-thick InAs for InAs/Al$_{0.45}$Ga$_{0.55}$Sb TFET at 300 K.
Figure 16B:
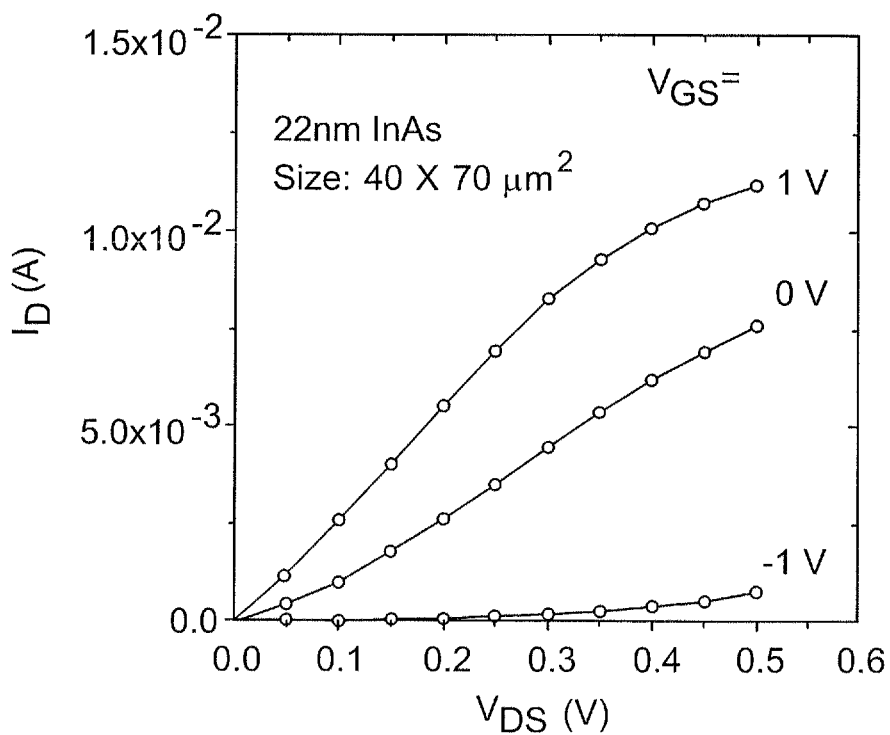
Figure 16C:
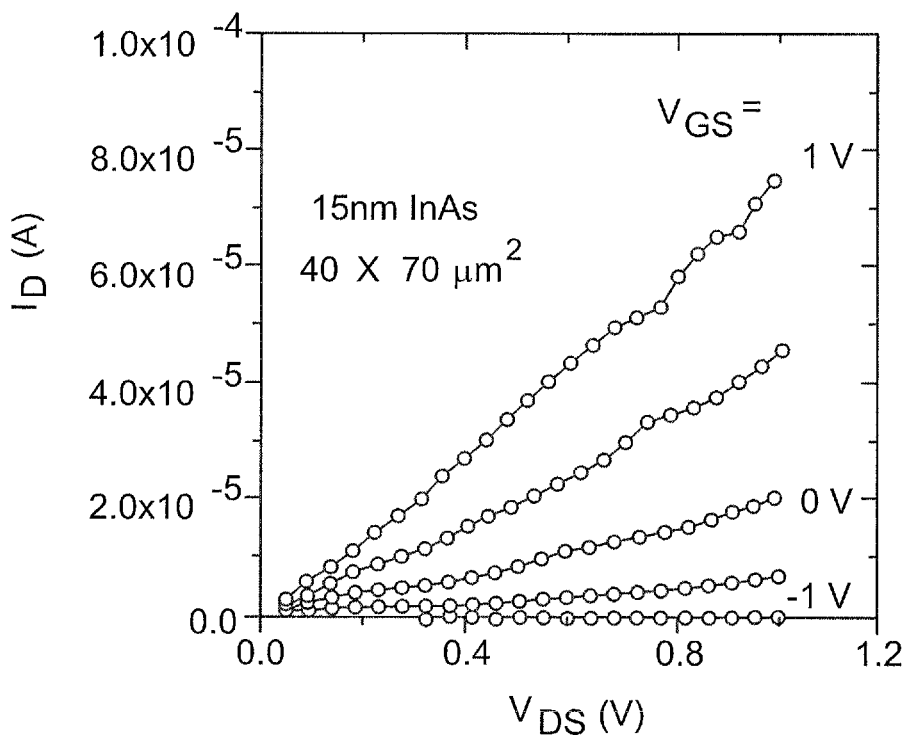
Figure 17A:
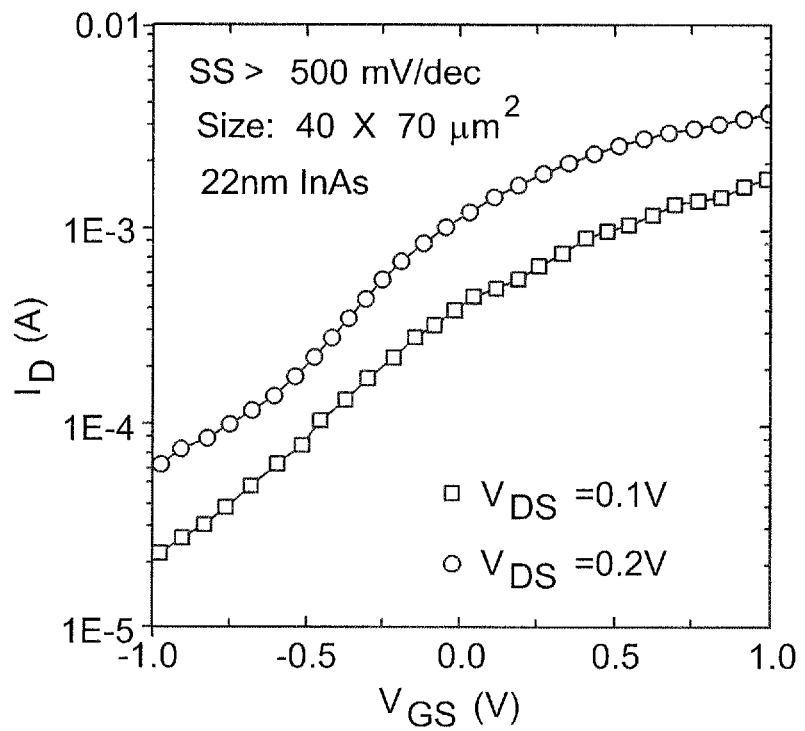
FIGS. 17a-c are measured ID-VGS curves for (a) a 22 nm thick InAs layer of a InAs/Al$_{0.45}$Ga$_{0.55}$Sb TFET at 300 K and (b) a 15-nm-thick InAs layer of a InAs/Al$_{0.45}$Ga$_{0.55}$Sb TFET at 300 K and (c) simulated ID-VGS curves for a 22 nm thick InAs layer of a InAs/Al$_{0.45}$Ga$_{0.55}$Sb TFETs with different parasitic resistances for a 40×70 µm² devices.
Figure 17B:
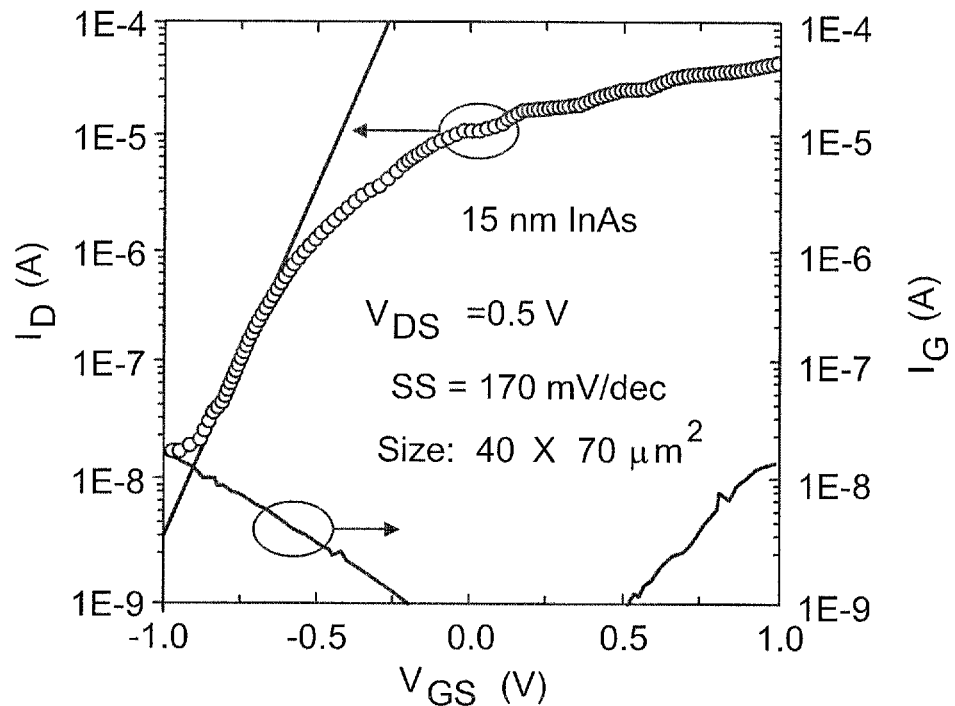
Figure 17C:
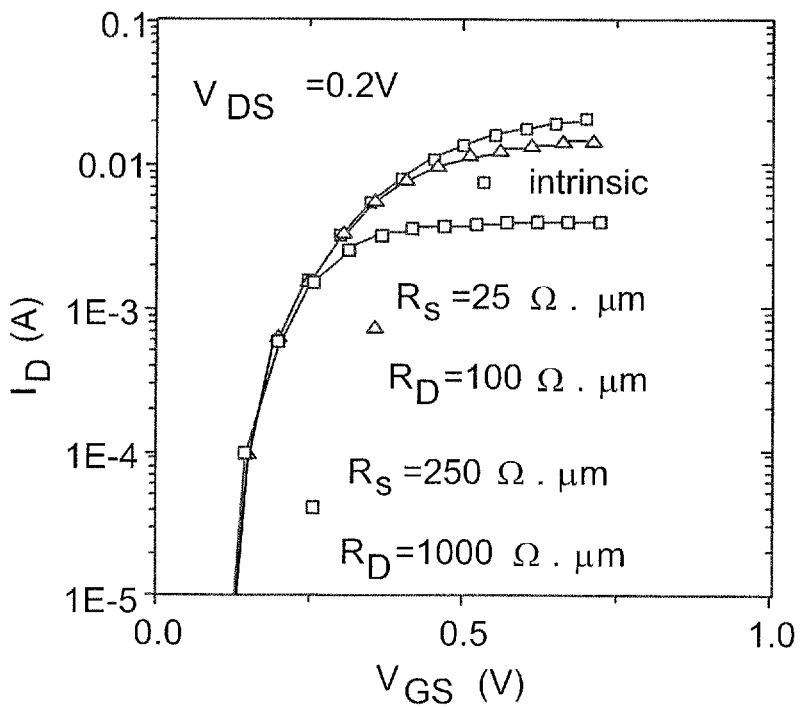

Shown in FIG. 16a-c are the measured I$_D$-V$_{DS}$ characteristics of a TFET 10 with a 30 nm, 22 nm and 15 nm top InAs drain-layer 50 thickness at 300 K, respectively. The respective on-currents are about 1200, 275 and 1 µA/µm at V$_{DS}$=0.5 V, while the gate 100 leakage is smaller than the drain current. The low on-current of the 15 nm InAs TFET 10 is due to the overetching of the AlGaSb source-tunneling-region 70 under the gate 100 and consequent higher access resistance results. Shown in FIG. 17 are the I$_D$-V$_{DS}$ characteristics of TFETs 10 with (a) 22 nm and (b) 15 nm of InAs drain-tunneling-region 80 at 300 K, respectively. While the drain current on/off ratio of a 30 nm InAs TFET 10 is about 2, it increases to 100 and 2000 as the top InAs drain-tunneling-region 80 is thinned to 22 nm and 15 nm, respectively. The measured SS is approximately 580 mV/dec and 170 mV/dec on the 22 nm and 15 nm thickness InAs TFETs 10, respectively. The stretch-out of the SS likely results from interface states at the Al$_2$O$_3$/InAs interface. FIG. 17c shows simulation results that include the impact of the calculated drain and source resistance (R$_S$=250 Ωµm, R$_D$=1000 Ωµm). The extrinsic on-current is expected to be one order magnitude lower than the intrinsic value for these devices. Larger on-current is expected with reduced parasitic resistances. The off current (I$_{FF}$), however, appears to be limited by trap-assisted tunneling in the interface between the InAs drain-tunneling-region and the Al$_{0.45}$Ga$_{0.55}$Sb source-tunneling-region 70.

Figure 18A:
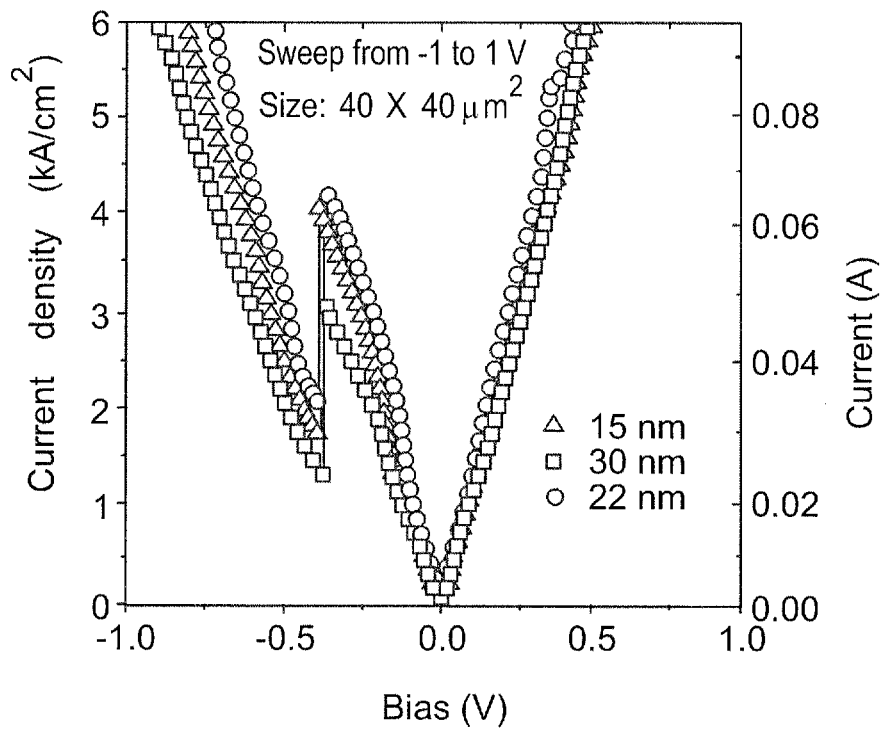
FIGS. 18a-c depict (a) measured and (b) simulated I-V characteristics of InAs/AlGaSb tunnel diodes with different InAs thickness and (c) $I_{ON}$ and $I_{OFF}$ comparisons of previously configured III-V TFETs versus that of TFETs of the present application.
Figure 18B:
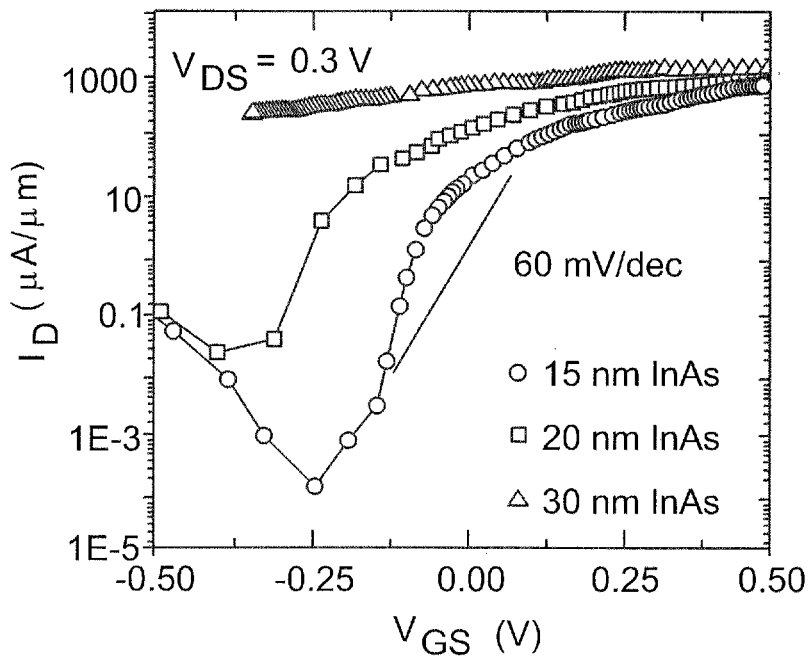
Figure 18C:
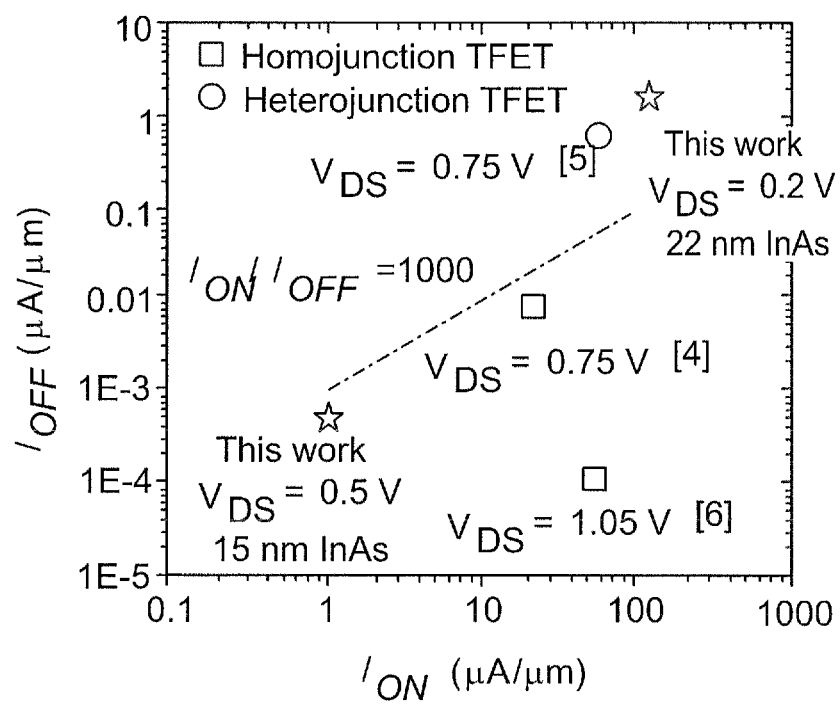

FIG. 18a depicts the I-V characteristics of vertical tunnel diodes 290 fabricated from the same epitaxy and confirm that the observed gate-modulated drain current stems from tunneling since negative differential resistance (NDR) can be clearly observed under negative bias. FIG. 18b shows the simulated I$_D$-V$_{DS}$ characteristics at V$_{DS}$=0.3 V with different InAs thicknesses, but assuming a doping of 1×10$^{18}$ cm$^{-3}$. These simulations show the reduction of on current and improvement of SS with decreasing InAs thickness, which is consistent with the measurements.

In conclusion, a new self-aligned tunnel FET geometry is described and demonstrated for the first time. The process and the device features staggered InAs/Al$_{0.45}$Ga$_{0.55}$Sb heterojunctions, and self-alignment using Si$_3$N$_4$ sidewall spacers.

In conclusion, a new self-aligned tunnel FET geometry is described and demonstrated for the first time. The process and the device features staggered InAs/Al$_{0.45}$Ga$_{0.55}$Sb heterojunctions, and self-alignment using Si$_3$N$_4$ sidewall spacers.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A tunnel field-effect transistor comprising:
   a p-n tunnel junction comprising:
      a source-layer comprising a source-tunneling-region;
      a drain-layer comprising a drain-tunneling-region and underneath the drain-layer an air-bridge that substantially restricts electrical conduction between the drain-layer and the source-layer through the drain-tunneling-region and the source-tunneling-region; and a depletion region formed at the interface of the source-tunneling-region and drain-tunneling-region in which the depletion region exhibits an internal electric field that substantially points between the source-tunneling-region and drain-tunneling-region when no external electric field is imposed;

a gate-dielectric interfaced onto the drain-tunneling-region such that the drain-tunneling-region is immediately between the source-tunneling-region and the gate-dielectric;

a gate interfaced onto the gate-dielectric wherein the gate is configured to impose an external electric field which is oriented substantially in parallel to the internal electric field of the depletion region;

a source-contact coupled to the source-layer; and a drain-contact coupled to the drain-layer.

2. A tunnel field-effect transistor as defined in claim 1, wherein when the external electric field is imposed substantially in parallel to the internal electric field of the depletion region and when the external electric field is pointed in a substantially same direction as that of the internal electric field of the depletion region, then tunneling from the source-tunneling-region to the drain-tunneling-region across the depletion region is promoted.

3. A tunnel field-effect transistor as defined in claim 2, wherein tunneling between the source-tunneling-region and the drain-tunneling-region is promoted substantially normal to a gate/dielectric-interface.

4. A tunnel field-effect transistor as defined in claim 1, wherein the tunnel field-effect transistor does not have an intrinsic layer between the source-tunneling-region and the drain-tunneling-region.

5. A tunnel field-effect transistor as defined in claim 1, wherein the gate-dielectric is not interfaced across the depletion region.

6. A tunnel field-effect transistor as defined in claim 1, wherein gate-dielectric is not directly contacted to the depletion region.

7. A tunnel field-effect transistor as defined in claim 1, wherein the source-layer comprises a p-doped $Al_xGa_{1-x}Sb$ source-layer and the drain-layer comprises an n-doped InAs drain-layer wherein the subscript x is between 0 and 1.

8. A tunnel field-effect transistor as defined in claim 1 further comprises a substrate on the source-layer.

9. A tunnel field-effect transistor as defined in claim 1, wherein the source-layer and drain-layer comprise substantially identical semiconductor material but have respectively different doping types.

10. A tunnel field-effect transistor as defined in claim 1 wherein the gate-dielectric exhibits a dielectric constant greater than that of silicon oxide.

11. A tunnel field-effect transistor as defined in claim 1, wherein a valence band edge of the source-tunneling-region substantially is within about 100 meV that of a conduction band edge of the drain-tunneling-region.

12. A tunnel field-effect transistor as defined in claim 1, wherein the source-layer or drain-layer comprise a semiconductor composition selected from the group consisting of Group III-V compositions, Group II-VI compositions, and Group IV compositions.

13. A tunnel field-effect transistor as defined in claim 1, further comprising a moat around the tunnel field-effect transistor.

14. A tunnel field-effect transistor as defined in claim 13, wherein the moat substantially electrically isolates the tunnel field-effect transistor and substantially eliminates conduction below the drain contact.

15. A tunnel field-effect transistor as defined in claim 1, further comprising a passivation layer covering over the tunnel field-effect transistor.

16. A tunnel field-effect transistor comprising:

a p-n tunnel junction comprising:

a source-layer comprising a p-doped InP source-layer and a source-tunneling-region;

a drain-layer comprising an n-doped $In_xGa_{1-x}As$ drain-layer wherein the subscript x is between 0 and 1 and a drain-tunneling-region; and a depletion region formed at the interface of the source-tunneling-region and drain-tunneling-region in which the depletion region exhibits an internal electric field that substantially points between the source-tunneling-region and drain-tunneling-region when no external electric field is imposed;

a gate-dielectric interfaced onto the drain-tunneling-region such that the drain-tunneling-region is immediately between the source-tunneling-region and the gate-dielectric;

a gate interfaced onto the gate-dielectric wherein the gate is configured to impose an external electric field which is oriented substantially in parallel to the internal electric field of the depletion region;

a source-contact coupled to the source-layer; and a drain-contact coupled to the drain-layer.

* * * * *